(12) United States Patent
Lu et al.

(10) Patent No.: US 11,847,383 B2
(45) Date of Patent: Dec. 19, 2023

(54) METHOD FOR DETERMINING A PERFORMANCE OF AN UNSATURATED SUBGRADE OF A MULTI-LAYERED EXPRESSWAY SECTION AND PROCESSING DEVICE THEREOF

(71) Applicant: INSTITUTE OF ROCK AND SOIL MECHANICS, CHINESE ACADEMY OF SCIENCES, Wuhan (CN)

(72) Inventors: Zheng Lu, Wuhan (CN); Chuxuan Tang, Wuhan (CN); Hailin Yao, Wuhan (CN); Yang Zhao, Wuhan (CN); Jie Liu, Wuhan (CN)

(73) Assignee: INSTITUTE OF ROCK AND SOIL MECHANICS, CHINESE ACADEMY OF SCIENCES, Wuhan (CN)

( * ) Notice: Subject to any disclaimer, the term of this patent is extended or adjusted under 35 U.S.C. 154(b) by 0 days.

(21) Appl. No.: 18/054,898

(22) Filed: Nov. 12, 2022

(65) Prior Publication Data
US 2023/0195953 A1    Jun. 22, 2023

(30) Foreign Application Priority Data

Dec. 2, 2021    (CN) .......................... 202111460692.4

(51) Int. Cl.
*G06F 30/13* (2020.01)
*G06F 17/14* (2006.01)

(52) U.S. Cl.
CPC .............. *G06F 30/13* (2020.01); *G06F 17/14* (2013.01)

(58) Field of Classification Search
CPC .......... G06F 30/00; G06F 30/13; G06F 17/14; G06F 2119/14
USPC ............................................................ 703/1
See application file for complete search history.

(56) References Cited

U.S. PATENT DOCUMENTS

| 5,268,097 | A  | 12/1993 | Girot et al. |
| 6,602,994 | B1 | 8/2003 | Cash et al. |

FOREIGN PATENT DOCUMENTS

| CN | 103175505 A | 6/2013 |
| CN | 107330191 A | 11/2017 |
| CN | 107560951 A | 1/2018 |
| CN | 108446417 A | 8/2018 |
| CN | 109295826 A | 2/2019 |

(Continued)

OTHER PUBLICATIONS

Decision to grant a patent (Notification to Grant Patent Right for Invention) in CN 202111460692.4 dated Aug. 10, 2022.

(Continued)

*Primary Examiner* — Cedric Johnson
(74) *Attorney, Agent, or Firm* — SYNCODA LLC; Feng Ma

(57) ABSTRACT

A method for determining a performance of a subgrade of an expressway section and a processing device thereof are used to accurately calculate a stress, a displacement, a velocity and an acceleration at any position inside the subgrade while analyzing the performance of the subgrade of the target expressway section, in full consideration of the moving speed and vibration characteristics of the vehicle load, the layered characteristics of the expressway and the unsaturated characteristics of the subgrade soil.

5 Claims, 4 Drawing Sheets

(56) References Cited

FOREIGN PATENT DOCUMENTS

| CN | 111339694 | A | * | 6/2020 | ............ E01B 1/002 |
|---|---|---|---|---|---|
| CN | 111339694 | A | | 6/2020 | |
| CN | 111695200 | A | | 9/2020 | |
| CN | 113408204 | A | * | 9/2021 | |
| CN | 113408204 | A | | 9/2021 | |
| JP | 2007309032 | A | | 11/2007 | |

OTHER PUBLICATIONS

China First office action in Application No. 202111460692.4, dated Jun. 2, 2022.

Lu, Zheng, et al.: Research on influence depth of road subgrade induced by vehicle loads, Rock and Soil Mechanics, vol. 34 No. 2, Feb. 2013.

Lu, Zheng, et al.: Structural analysis and design method of dynamic deformation for highway subgrade, Rock and Soil Mechanics, vol. 31 No. 9, Sep. 2010.

Lu, Zheng: Study on the Dynamic Responses of Highway Structure Layers under Traffic Loads and the Design Method of Dynamic Strength, Dissertation for the PHD of Engineering Mechanics, Institute of Rock and Soil Mechanics, Chinese Academy of Sciences, Jun. 2009.

* cited by examiner

METHOD FOR DETERMINING A PERFORMANCE OF AN UNSATURATED SUBGRADE OF A MULTI-LAYERED EXPRESSWAY SECTION AND PROCESSING DEVICE THEREOF

CROSS-REFERENCE TO RELATED APPLICATION

The present disclosure claims priority to Chinese Patent Application No. 202111460692.4 filed on Dec. 2, 2021, the disclosure of which is hereby incorporated by reference in its entirety.

BACKGROUND

An expressway is generally considered to be composed of a surface layer, a base layer and a subgrade. Under the action of vehicle load, the subgrade will bear a vibration load transmitted from an upper structure. Long-term vibration load during the service life will render the plastic deformation of subgrade soil gradually accumulated to thereby produce uneven settlement, which may lead to damage, like cavitation or cracking, of the upper surface structure. Thus, in order to guarantee long service life of expressways, it is necessary to quantify the mechanical properties of the subgrade in the road structure design.

At present, a commonly used calculation method is to simplify the structure of the expressway as a layered elastic medium, and simplify the vehicle load as a static load that is constant or vibrates at a certain frequency.

However, during the researches on current related technologies, the inventors found that in the real service state, the vehicle load is movable, and the subgrade soil is usually in an unsaturated state. Three phases, i.e., solid phase, liquid phase and gas phase, coexist in soil, and water and gas in the pores will greatly affect the mechanical properties of the soil. The layered elastic model completely neglects the multiple phases of soil, and does not take into consideration the influence of the change in water-containing state inside the subgrade on the entire structure, which will result in significant errors in the predication of the mechanical properties of the subgrade.

SUMMARY

The embodiments of the disclosure relate to the field of geology, and particularly to a method for determining a performance of an unsaturated subgrade of a multi-layered expressway section and a processing device thereof.

The present disclosure provides a method for determining a performance of an unsaturated subgrade of a multi-layered expressway section, as well as a processing device thereof, which are used to accurately calculate a stress, a displacement, a velocity and an acceleration at any position inside the subgrade while analyzing the performance of the subgrade of the target expressway section, in full consideration of the moving speed and vibration characteristics of the vehicle load, the layered characteristics of the expressway and the unsaturated characteristics of the subgrade soil.

In a first aspect, the present disclosure provides a method for determining a performance of an unsaturated subgrade of a multi-layered expressway section. The method may include:

Step S101: a processing device using an Odemark equivalent hypothesis of modulus-thickness to simplify a road structure of a target expressway section into a three-layered model, wherein the three-layered model is $$H_e = \left(\frac{E}{E_1}\right)^{1/3} H,$$

wherein $H_e$ is an equivalent thickness, E is a modulus of a layer to be transformed, H is a thickness of the layer to be transformed, and $E_1$ is a modulus of a target layer;

Step S102: based on the three-layered model, the processing device setting a base layer of the target expressway section as an elastic medium and setting the subgrade of the target expressway section as an unsaturated porous medium to derive and obtain a rigid pavement governing equation, a flexible pavement and base layer governing equation, and an unsaturated subgrade governing equation, wherein the rigid pavement governing equation is:

$$D_p\left[\frac{\partial^4 W(x, y, t)}{\partial x^4} + 2\frac{\partial^4 W(x, y, t)}{\partial x^2 \partial y^2} + \frac{\partial^4 w(x, y, t)}{\partial y^4}\right] + \rho_p h_p \ddot{W}(x, y, t) + \varphi(x, y, t) = f(x, y, t),$$

wherein $D_p = E_p h_p^3/[12(1-\mu_p^2)]$ is a bending rigidity of a pavement slab, W(x, y, t) is a vertical displacement of the pavement slab, $E_p$, $\rho_p$ and $h_p$ are respectively a modulus, a density and a thickness of the pavement slab, f(x, y, t) is a traffic load on the pavement slab, and $\varphi(x, y, t)$ is a reaction force exerted by the base layer on the pavement slab, the flexible pavement and base layer governing equation is $$\begin{cases} G_b u^b_{i,jj} + (\lambda_b + G_b)u^b_{j,ji} = \rho_b \ddot{u}^b_i \\ \tau^b_{ij} = \lambda_b \theta_b \delta_{ij} + 2G_b \varepsilon^b_{ij} \end{cases},$$

wherein $u^b$ is a displacement of an elastic medium layer, $G_b$ and $\lambda_b$ are Lame constants of the elastic medium layer, $\rho_b$ is a density of the elastic medium layer, $\tau^b$ is a stress of the elastic medium layer, $\tau^b$ and $\varepsilon^b$ respectively represent the stress of the elastic medium layer and a strain of the elastic medium layer, and $\delta_{ij}$ is a Kronecker symbol, the unsaturated subgrade governing equation is $$\begin{cases} -p_{w,i} = \rho_w \ddot{u}_i + \frac{\rho_w}{nS_r}\ddot{W}_i + \frac{\rho_w g}{k_w}\dot{W}_i \\ -p_{a,i} = \rho_a \ddot{u}_i + \frac{\rho_a}{n(1-S_r)}\ddot{V}_i + \frac{\rho_a g}{k_a}\dot{V}_i \\ A_{11}p_w + A_{12}p_a + A_{13}\nabla \cdot \dot{u}_i + A_{14}\nabla \cdot \dot{V}_i = 0 \\ A_{21}p_w + A_{22}p_a + A_{23}\nabla \cdot \dot{u}_i + A_{24}\nabla \cdot \dot{W}_i = 0 \\ \mu\nabla^2 \dot{u}_i + (\lambda + G)\nabla e - a\chi\nabla p_w - a(1-\chi)\nabla p_a = \rho\ddot{u}_i + \rho_w \ddot{W}_i + \rho_a \ddot{V}_i \end{cases}$$

wherein $$A_{11} = nA_s + (1-S_r)\frac{a\chi - nS_r}{K_s},$$

$$A_{12} = (1-S_r)\left[\frac{a(1-\chi) - n(1-S_r)}{K_s} + \frac{n}{K_a}\right] - nA_s,$$

$$A_{13} = (1-S_r)\left(1 - \frac{K_b}{K_s}\right), A_{14} = 1,$$

-continued $$A_{21} = \frac{(a\chi - nS_r)S_r}{K_s} - nA_s + \frac{nS_r}{K_w},$$

$$A_{22} = \frac{[a(1-\chi) - n(1-S_r)]S_r}{K_s} + nA_s,$$

$$A_{23} = \left(1 - \frac{K_b}{K_s}\right)S_r, A_{24} = 1,$$

$$A_s = -\alpha m d(1-S_0)(S_e)^{\frac{m+1}{m}}\left[(S_e)^{-\frac{1}{m}} - 1\right]^{\frac{d-1}{d}},$$

$$a = 1 - K_b/K_s, K_b \text{ and } K_s$$

are bulk compressibility moduli of soil skeletons and soil particles respectively, $p_w$ and $p_a$ are pressures of pore water and gas respectively, $\rho_w$ and $\rho_a$ are densities of pore water and gas respectively, $W_i$ and $V_i$ are displacement components of pore water and pore gas relative to soil particles in an i direction, g represents a gravitational acceleration, $k_w$ and $k_a$ represent permeability coefficients of pore water and pore gas respectively, $\chi$ is an effective stress parameter, $\alpha$, m and d are fitting parameters of a soil-water characteristic curve model, $S_e$ is an effective saturation, $S_{w0}$ is an irreducible saturation, n is a soil porosity, and $S_r$ is a saturation;

Step S103: based on an action form of a vehicle load, the processing device respectively setting time terms of variables in the rigid pavement governing equation, the flexible pavement and base layer governing equation and the unsaturated subgrade governing equation as a simple harmonic form $e^{i\Omega_0 t}$ and separating the simple harmonic form $e^{i\Omega_0 t}$ of the time terms from the rigid pavement governing equation, the flexible pavement and base layer governing equation and the unsaturated subgrade governing equation, and then using a double Fourier transform to respectively reduce partial derivatives in a three-dimensional space domain of the rigid pavement governing equation, the flexible pavement and base layer governing equation and the unsaturated subgrade governing equation as ordinary differential equations, to obtain element stiffness matrices of different layer positions after solving and then establish a total dynamic stiffness matrix, wherein the double Fourier transform is $$\bar{f}(\beta, \gamma, z, t) = \int_{-\infty}^{\infty}\int_{-\infty}^{\infty} f(x, y, z, t)e^{-i(\beta x + \gamma y)}dxdy,$$

$$f(x, y, z, t) = \frac{1}{4\pi^2}\int_{-\infty}^{\infty}\int_{-\infty}^{\infty} \bar{f}(\beta, \gamma, z, t)e^{i(\beta x + \gamma y)}d\beta d\gamma,$$

wherein $\beta$ and $\gamma$ are wave numbers in x and y directions respectively, and f and $\bar{f}$ are variables in the space domain and a corresponding transform domain respectively, the rigid pavement governing equation in the transform domain is:

$$\overline{W}(\beta,\gamma)[D_p(\beta^2+\gamma^2)^2 - \Omega^2\rho_p h_p] + \overline{\varphi}(\beta,\gamma) = \bar{f}(\beta,\gamma),$$

a stress-strain relationship of the flexible pavement in the transform domain is:

$$\left\{\sum\nolimits_P\right\} = [S^p][D^p]^{-1}\{\bar{U}_P\} = [K^p]\{\bar{U}_P\},$$

$$[D^p] = \begin{bmatrix} \frac{-i\beta e^{-\alpha_1 h}}{k_1^2} & \frac{-i\beta}{k_1^2} & e^{-\alpha_2 h} & 1 & 0 & 0 \\ \frac{-i\gamma e^{-\alpha_1 h}}{k_1^2} & \frac{-i\gamma}{k_1^2} & 0 & 0 & e^{-\alpha_2 h} & 1 \\ \frac{-i\alpha_1 e^{-\alpha_1 h}}{k_1^2} & \frac{i\alpha_1}{k_1^2} & \frac{\beta}{\alpha_2}e^{-\alpha_2 h} & \frac{-\beta}{\alpha_2} & \frac{\gamma}{\alpha_2}e^{-\alpha_2 h} & \frac{-\gamma}{\alpha_2} \\ \frac{-i\beta}{k_1^2} & \frac{-i\beta e^{-\alpha_1 h}}{k_1^2} & 1 & e^{-\alpha_2 h} & 0 & 0 \\ \frac{-i\gamma}{k_1^2} & \frac{-i\gamma e^{-\alpha_1 h}}{k_1^2} & 0 & 0 & 1 & e^{-\alpha_2 h} \\ \frac{-i\alpha_1}{k_1^2} & \frac{i\alpha_1 e^{-\alpha_1 h}}{k_1^2} & \frac{\beta}{\alpha_2} & \frac{-\beta}{\alpha_2}e^{-\alpha_2 h} & \frac{\gamma}{\alpha_2} & \frac{-\gamma}{\alpha_2}e^{-\alpha_2 h} \end{bmatrix},$$

$$[S^p] = G_p \begin{bmatrix} \frac{2i\beta\alpha_1}{k_1^2}e^{-\alpha_1 h} & \frac{2i\beta\alpha_1}{k_1^2} & \frac{(\alpha_2^2+\beta^2)}{\alpha_2}e^{-\alpha_2 h} & \frac{(\alpha_2^2+\beta^2)}{\alpha_2} & \frac{\beta\gamma}{\alpha_2}e^{-\alpha_2 h} & \frac{\beta\gamma}{\alpha_2} \\ \frac{2i\gamma\alpha_1}{k_1^2}e^{-\alpha_1 h} & \frac{2i\gamma\alpha_1}{k_1^2} & \frac{\beta\gamma}{\alpha_2}e^{-\alpha_2 h} & \frac{\beta\gamma}{\alpha_2} & \frac{(\alpha_2^2+\gamma^2)}{\alpha_2}e^{-\alpha_2 h} & \frac{(\alpha_2^2+\gamma^2)}{\alpha_2} \\ \frac{i(2\alpha_2^2+k_2^2)}{k_1^2}e^{-\alpha_1 h} & \frac{i(2\alpha_2^2+k_2^2)}{k_1^2} & -2\beta e^{-\alpha_2 h} & -2\beta & -2\gamma e^{-\alpha_2 h} & -2\gamma \\ \frac{-2i\beta\alpha_1}{k_1^2} & \frac{2i\beta\alpha_1}{k_1^2}e^{-\alpha_1 h} & \frac{(\alpha_2^2+\beta^2)}{\alpha_2} & \frac{-(\alpha_2^2+\beta^2)}{\alpha_2}e^{-\alpha_2 h} & \frac{\beta\gamma}{\alpha_2} & \frac{\beta\gamma}{\alpha_2}e^{-\alpha_2 h} \\ \frac{-2i\gamma\alpha_1}{k_1^2} & \frac{2i\gamma\alpha_1}{k_1^2}e^{-\alpha_1 h} & \frac{\beta\gamma}{\alpha_2} & \frac{\beta\gamma}{\alpha_2}e^{-\alpha_2 h} & \frac{(\alpha_2^2+\gamma^2)}{\alpha_2} & \frac{-(\alpha_2^2+\gamma^2)}{\alpha_2}e^{-\alpha_2 h} \\ \frac{-i(2\alpha_2^2+k_2^2)}{k_1^2} & \frac{-i(2\alpha_2^2+k_2^2)}{k_1^2}e^{-\alpha_1 h} & 2\beta & 2\beta e^{-\alpha_2 h} & 2\gamma & 2\gamma e^{-\alpha_2 h} \end{bmatrix},$$

wherein superscript 0 of elements in the matrix represents a top surface of a flexible pavement layer, and superscript 1 of elements in the matrix represents a bottom surface of the flexible pavement layer, a stress vector $$\{\textstyle\sum_P\} = \{-\bar{\tau}_{xz,p}^0 \;\; -\bar{\tau}_{yz,p}^0 \;\; -i\bar{\tau}_{zz,p}^0 \;\; \bar{\tau}_{xz,p}^1 \;\; \bar{\tau}_{yz,p}^1 \;\; i\bar{\tau}_{zz,p}^1\}^T, \; [D^p]$$

is a displacement matrix of the flexible pavement, $[S^p]$ is a stress matrix of the flexible pavement, a displacement vector $\{\overline{U}_P\}=\{\bar{u}_{x,p}{}^0 \; \bar{u}_{y,p}{}^0 \; i\bar{u}_{z,p}{}^0 \; \bar{u}_{x,p}{}^1 \; \bar{u}_{y,p}{}^1 \; i\bar{u}_{z,p}{}^1\}^T$, $[K^p]=[S^p][D^p]^{-1}$ is a dynamic stiffness matrix of the flexible pavement layer, $\alpha_1^2=\beta^2+\gamma^2-k_1^2$, $\alpha_2^2=\beta^2+\gamma^2-k_2^2$, $k_1^2=\omega^2/c_1^2$, $k_2^2=\omega^2/c_2^2$, c is a traffic load velocity, $c_1$ and $c_2$ are a compression wave velocity and a shear wave velocity of the elastic medium, respectively, $\omega=\Omega_0-\beta c$, h represents a thickness of the flexible pavement layer, and i is an imaginary number, a stress-strain relationship of the elastic base layer in the transform domain is:

$$\{\textstyle\sum_b\}=[S^b][D^b]^{-1}\{\overline{U}_b\}=[K^b]\{\overline{U}_b\},$$

a stress-strain relationship of the unsaturated subgrade in the transform domain is:

$$\{\textstyle\sum_s\} = [S^s][D^s]^{-1}\{\overline{U}_s\} = [K^s]\{\overline{U}_s\},$$

$$[D^s] = \begin{bmatrix} -\dfrac{\gamma}{\beta}e^{-\lambda_0 z} & \dfrac{i\lambda_0}{\beta}e^{-\lambda_0 z} & S_1 i\beta e^{-\lambda_1 z} & S_2 i\beta e^{-\lambda_2 z} & S_3 i\beta e^{-\lambda_3 z} \\ e^{-\lambda_0 z} & 0 & S_1 i\gamma e^{-\lambda_1 z} & S_2 i\gamma e^{-\lambda_2 z} & S_3 i\gamma e^{-\lambda_3 z} \\ 0 & -ie^{-\lambda_0 z} & -iS_1\lambda_1 e^{-\lambda_1 z} & -iS_2\lambda_2 e^{-\lambda_2 z} & -iS_3\lambda_3 e^{-\lambda_3 z} \\ 0 & -\dfrac{\omega^2}{b^w}e^{-\lambda_0 z} & -\dfrac{B_{w1}}{b^w \rho_w}e^{-\lambda_1 z} & -\dfrac{B_{w2}}{b^w \rho_w}e^{-\lambda_2 z} & -\dfrac{B_{w3}}{b^w \rho_w}-e^{-\lambda_3 z} \\ 0 & -\dfrac{\omega^2}{b^a}e^{-\lambda_0 z} & -\dfrac{B_{a1}}{b^a \rho_a}e^{-\lambda_1 z} & -\dfrac{B_{a2}}{b^a \rho_a}e^{-\lambda_2 z} & -\dfrac{B_{a3}}{b^a \rho_a}e^{-\lambda_3 z} \end{bmatrix},$$

$$[S^s] = \begin{bmatrix} -\dfrac{\gamma\lambda_0 G}{\beta}e^{-\lambda_0 z} & iG\left(\dfrac{\lambda_0^2}{\beta}+\beta\right)e^{-\lambda_0 z} & 2GS_1 i\beta\lambda_1 e^{-\lambda_1 z} & 2GS_2 i\beta\lambda_2 e^{-\lambda_2 z} & 2GS_3 i\beta\lambda_3 e^{-\lambda_3 z} \\ G\lambda_0 e^{-\lambda_0 z} & iG\gamma e^{-\lambda_0 z} & 2GS_1 i\gamma\lambda_1 e^{-\lambda_1 z} & 2GS_2 i\gamma\lambda_2 e^{-\lambda_2 z} & 2GS_3 i\gamma\lambda_3 e^{-\lambda_3 z} \\ 0 & -i2G\lambda_0 e^{-\lambda_0 z} & -iB_1 e^{-\lambda_1 z} & -iB_2 e^{-\lambda_2 z} & -iB_3 e^{-\lambda_3 z} \\ 0 & 0 & -f_{w1}e^{-\lambda_1 z} & -f_{w2}e^{-\lambda_2 z} & -f_{w3}e^{-\lambda_3 z} \\ 0 & 0 & -f_{a1}e^{-\lambda_1 z} & -f_{a2}e^{-\lambda_2 z} & -f_{a3}e^{-\lambda_3 z} \end{bmatrix},$$

wherein $$\{\textstyle\sum_s\} = \{-\bar{\tau}_{xz,s} \;\; -\bar{\tau}_{yz,s} \;\; -i\bar{\tau}_{zz,s} \;\; -\bar{p}_w \;\; -\bar{p}_a\}^T,$$

$$\{\overline{U}_s\} = \{\bar{u}_{x,s} \;\; \bar{u}_{y,s} \;\; i\bar{u}_{z,s} \;\; \overline{W} \;\; \overline{V}\}^T, \quad B_{wn} = \omega^2 \rho_w S_n \lambda_n - f_{wn}\lambda_n,$$

$$B_{an} = \omega^2 \rho_a S_n \lambda_n - f_{an}\lambda_n, \quad B_n = 2\mu S_n \lambda_n^2 + \lambda - a\chi f_{wn} - a(1-\chi)f_{an},$$

$$S_n = -\dfrac{\lambda+\mu+b_1 f_{wn}+b_2 f_{an}}{b_3+\mu d_n}, \quad f_{an} = \dfrac{b_{13}b_{31}-b_{11}b_{33}+b_{11}d_n}{b_{11}b_{32}-b_{31}b_{12}+b_{31}d_n}, \quad f_m = \dfrac{b_{32}b_{23}-b_{22}b_{33}+b_{22}d_n}{b_{22}b_{31}-b_{32}b_{21}+b_{32}d_n},$$

$$\lambda_n = \sqrt{\beta^2+\gamma^2+d_n}, \quad d_n \text{ is roots of an equation } d_n^3+b_4 d_n^2+b_5 d_n+b_6=0, \quad b_4 = -b_{12}-b_{33}-b_{21},$$

$$b_5 = b_{12}b_{33}-b_{13}b_{32}+b_{21}b_{12}+b_{21}b_{33}-b_{22}b_{11}-b_{23}b_{31}$$

$$b_6 = -b_{21}b_{12}b_{33}-b_{13}b_{31}b_{22}-b_{23}b_{11}b_{32}+b_{21}b_{13}b_{32}+b_{22}b_{11}b_{33}+b_{23}b_{31}b_{12}, \quad n=1,2,3, \quad b_1 = -a\chi - \dfrac{\omega^2}{b^w},$$

$$b_2 = -a(1-\chi)-\dfrac{\omega^2}{b^a}, \quad b_3 = \rho\omega^2 + \dfrac{\omega^4 \rho_w}{b^w}+\dfrac{\omega^4 \rho_a}{b^a}, \quad b_{11}=b^a\rho_a A_{11}, \quad b_{12}=b^a\rho_a A_{12}$$

$$b_{13} = \omega^2 \rho_a + b^a \rho_a A_{13}, \quad b_{21} = b^w \rho_w A_{21}, \quad b_{22} = b^w \rho_w A_{22}, \quad b_{23} = \omega^2 \rho_w + b^w \rho_w A_{23},$$

$$b_{31} = -\dfrac{b_1 b_{21}+b_2 b_{11}}{\lambda+2\mu}, \quad b_{32} = -\dfrac{b_1 b_{22}+b_2 b_{12}}{\lambda+2\mu}, \quad b_{33} = -\dfrac{b_1 b_{23}+b_2 b_{13}+b_3}{\lambda+2\mu}, \quad b^w = -\dfrac{\omega^2}{nS_r}+\dfrac{i\omega g}{k_w},$$

$$b^a = -\dfrac{\omega^2}{n(1-S_r)}+\dfrac{i\omega g}{k_a},$$

a total stiffness matrix of a flexible pavement expressway model is:

$$\{\Sigma_f\} = [K^f]\{U_f\},$$

wherein $\{\Sigma_f\} = \{-\overline{\tau}_{xz,p}{}^0 \; -\overline{\tau}_{yz,p}{}^0 \; -i\overline{\tau}_{zz,p}{}^0 \; 0 \; 0 \; 0 \; 0 \; 0 \; 0 \; 0 \; 0\}^T$, $\{U_f\} = \{\overline{u}_x{}^0 \; \overline{u}_y{}^0 \; i\overline{u}_z{}^0 \; \overline{u}_x{}^1 \; \overline{u}_y{}^1 \; i\overline{u}_z{}^1 \; \overline{u}_x{}^2 \; \overline{u}_y{}^2 \; i\overline{u}_z{}^2 \; \overline{W}^2 \; \overline{V}^2\}^T$, superscripts 0, 1, 2 correspond to different layer positions shown from top to bottom in the three-layered model, and $[K^f]$ is a matrix of 11×11, a total stiffness matrix of a rigid pavement expressway model is:

$$\{\Sigma_r\} = [K^r]\{U_r\},$$

wherein $\{\Sigma_r\} = \{-\overline{\tau}_{xz,b}{}^1 \; -\overline{\tau}_{yz,b}{}^1 \; -i\overline{\tau}_{zz,b}{}^1 \; 0 \; 0 \; 0 \; 0 \; 0\}^T$, $\{U_r\} = \{\overline{u}_x{}^1 \; \overline{u}_y{}^1 \; i\overline{u}_z{}^1 \; \overline{u}_x{}^2 \; \overline{u}_y{}^2 \; i\overline{u}_z{}^2 \; \overline{W}^2 \; \overline{V}^2\}^T$, and $[K^r]$ is a matrix of 8×8;

Step S104: the processing device determining a load form and a load size according to a specific vehicle, substituting the load form and the load size as boundary conditions into the stiffness matrix of a corresponding model to solve and obtain a solution $\bar{f}$ of a parameter to be solved in a frequency domain, wherein the load form and the load size determined based on the specific vehicle are $$f(x_1, y_1, t) = \begin{cases} \dfrac{Pe^{i\Omega_0 t}}{4 l_1 l_2}; & \begin{cases} (d_a - l_1) \le x_1 - Vt \le (d_a + l_1), (d_w + d_t - l_2) \le \\ |y_1| \le (d_w + d_t + l_2) \\ (d_a - l_1) \le x_1 - Vt \le (d_a + l_1), (d_w - d_t - l_2) \le \\ |y_1| \le (d_w + d_t + l_2) \\ (-d_a - l_1) \le x_1 - Vt \le (-d_a + l_1), (d_w + d_t - l_2) \le \\ |y_1| \le (d_w + d_t + l_2) \\ (-d_a - l_1) \le x_1 - Vt \le (-d_a + l_1), (d_w - d_t - l_2) \le \\ |y_1| \le (d_w - d_t + l_2) \\ (d_a - l_1) \le x_1 - Vt \le (d_a + l_1), (d_w - l_2) \le \\ |y_1| \le (d_w + l_2) \end{cases} \\ 0; & \text{others} \end{cases}$$

wherein P represents a total axle load of the specific vehicle, and in a moving coordinate system, $x = x_1 - Vt$, $y = y_1$, $z = z_1$;

wherein in the transform domain, the load form and the load size determined based on the specific vehicle are $$\bar{f}(\beta, \gamma) = \dfrac{P(e^{-i\gamma d_w} + e^{\gamma\gamma d_w})}{10 l_1 l_2 \beta \gamma}$$

$$[\sin(\beta l_1)\sin(\gamma l_2)e^{-i\beta d_c} + \sin(\beta l_1)\sin(\gamma l_2)(e^{-i\beta d_a} + e^{i\beta d_a})(e^{-i\gamma d_t} + e^{i\gamma d_t})]$$

a boundary condition of the rigid pavement expressway model is:

$$\begin{cases} \tau_{zz,b}^1(x, y, t) = -\varphi(x, y, t) \\ \tau_{xz,b}^1(x, y, t) = \tau_{yz,b}^1 p(x, y, t) = p_w^2(x, y, t) = p_a^2(x, y, t) = 0 \\ u_{zz,b}^1(x, y, t) = W(x, y, t) \end{cases}$$

the boundary condition of the rigid pavement expressway model with the time term $e^{i\Omega_0 t}$ removed is expressed as:

$$\begin{cases} \overline{\tau}_{zz,b}^1(\beta, \gamma) = -\overline{\varphi}(\beta, \gamma) \\ \overline{\tau}_{xz,b}^1(\beta, \gamma) = \overline{\tau}_{yz,b}^1(\beta, \gamma) = \overline{p}_w^2(\beta, \gamma) = \overline{p}_a^2(\beta, \gamma) = 0 \\ \overline{u}_{zz,b}^1(\beta, \gamma) = \overline{W}(\beta, \gamma) \end{cases}$$

wherein $$\overline{\varphi}(\beta, \gamma) = \dfrac{\bar{f}(\beta, \gamma)}{1 + B_{33} D_P(\beta^2 + \gamma^2)^2 - B_{33}\omega^2 m_b},$$

and $B_{33}$ is an element in a third row and a third column of $[K^r]^{-1}$ and corresponds to a vertical displacement of the base layer, a boundary condition of the flexible pavement expressway model is:

$$\begin{cases} \tau_{zz,p}^0(x, y, t) = f(x, y, t) \\ \tau_{xz}^0(x, y, t) = \tau_{yz}^0(x, y, t) = p_w^2(x, y, t) = p_a^2(x, y, t) = 0 \end{cases},$$

the boundary condition of the flexible pavement expressway model with the time term $e^{i\Omega_0 t}$ removed is expressed as:

$$\begin{cases} \overline{\tau}_{zz,p}^0(\beta, \gamma) = \bar{f}(\beta, \gamma) \\ \overline{\tau}_{xz}^0(\beta, \gamma) = \overline{\tau}_{yz}^0(\beta, \gamma) = \overline{p}_w^2(\beta, \gamma) = \overline{p}_a^2(\beta, \gamma) = 0 \end{cases},$$

wherein for the rigid pavement expressway model, the corresponding boundary condition is substituted into the total stiffness matrix of the rigid pavement expressway model, and for the flexible pavement expressway model, the corresponding boundary condition is substituted into the total stiffness matrix of the flexible pavement expressway model, in such a way to obtain the displacement of each surface, the displacement $\{\overline{u}_x{}^2 \; \overline{u}_y{}^2 \; i\overline{u}_z{}^2 \; \overline{W}^2 \; \overline{V}^2\}$ of the top surface of the subgrade is substituted into the stress-strain relationship of the unsaturated subgrade in the transform domain to obtain the a stress $\{\overline{\tau}_{xz,s} \; \overline{\tau}_{yz,s} \; \overline{\tau}_{zz,s} \; \overline{p}_w \; \overline{p}_\alpha\}$ and a displacement $\{\overline{u}_x{}^2 \; \overline{u}_y{}^2 \; \overline{u}_z{}^2 \; \overline{W}^2 \; \overline{V}^2\}$ at any position inside the subgrade in the frequency domain, and a vibration velocity $\overline{v}_{ij} = i\omega \overline{u}_{ij}$ and an acceleration $\overline{a}_{ij} = -\omega \overline{u}_{ij}$ of the subgrade can be calculated according to the displacement;

Step S105: the processing device using an inverse fast Fourier transform to convert the solution $\bar{f}$ of the parameter to be solved in the frequency domain into a solution f in the time domain, wherein the solution f in the time domain is a stress $\{\tau_{xz,s} \; \tau_{yz,s} \; \tau_{zz,s} \; p_w \; p_\alpha\}$, a displacement $\{u^2{}_x \; u^2{}_y \; u^2{}_z \; W^2 \; V^2\}$, a velocity $v_{ij}$ and an acceleration $a_{ij}$.

In combination of the first aspect of the present disclosure, in the first possible implementation mode according to the first aspect of the present disclosure, the method further includes Step S106, which is prior to Step S101:

the processing device acquiring a task of determining the performance of the subgrade of the target expressway section.

In combination of the first possible implementation mode according to the first aspect of the present disclosure, in the second possible implementation mode according to the first aspect of the present disclosure, Step S106 specifically includes:

the processing device monitoring whether project data on a system are updated; and in response to monitoring that the project data are updated, the processing device acquiring the task of determining the performance of the subgrade of the target expressway section according to the updated project data.

In combination of the first possible implementation mode according to the first aspect of the present disclosure, in the third possible implementation mode according to the first aspect of the present disclosure, Step S106 specifically includes:

the processing device receiving the task of determining the performance of the subgrade of the target expressway section as inputted by a user.

In combination of the first aspect of the present disclosure, in the fourth possible implementation mode according to the first aspect of the present disclosure, the method further includes Step S107, which is subsequent to Step S105:

the processing device outputting the solution f in the time domain.

In combination of the fourth possible implementation mode according to the first aspect of the present disclosure, in the fifth possible implementation mode according to the first aspect of the present disclosure, Step S107 specifically includes:

the processing device outputting a performance determination report of the subgrade of the target expressway section, wherein the performance determination report includes the solution f in the time domain.

In combination of the first aspect of the present disclosure, in the sixth possible implementation mode according to the first aspect of the present disclosure, the method further includes Step S108, which is subsequent to Step S105:

the processing device determining whether a value of the solution f in the time domain reaches a predetermined alarm value; and in response to determining the value of the solution f in the time domain reaches the predetermined alarm value, the processing device outputting an alarm prompt.

In a second aspect, the present disclosure provides a processing device for determining a performance of an unsaturated subgrade of a multi-layered expressway section. The processing device includes a processor and a memory in which a computer program is stored, wherein when the computer program in the memory is executed, the processor is configured to:

use an Odemark equivalent hypothesis of modulus-thickness to simplify a road structure of a target expressway section into a three-layered model, wherein the three-layered model is $$H_e = \left(\frac{E}{E_1}\right)^{1/3} H,$$

wherein $H_e$ is an equivalent thickness, E is a modulus of a layer to be transformed, H is a thickness of the layer to be transformed, and $E_1$ is a modulus of a target layer;

based on the three-layered model, set a base layer of the target expressway section as an elastic medium and set the subgrade of the target expressway section as an unsaturated porous medium to derive and obtain a rigid pavement governing equation, a flexible pavement and base layer governing equation, and an unsaturated subgrade governing equation, wherein the rigid pavement governing equation is:

$$D_p\left[\frac{\partial^4 W(x,y,t)}{\partial x^4} + 2\frac{\partial^4 W(x,y,t)}{\partial x^3 \partial y^2} + \frac{\partial^4 W(x,y,t)}{\partial x^4}\right] + \rho_p h_p \ddot{W}(x,y,t) + \varphi(x,y,t) = f(x,y,t),$$

wherein $D_p = E_p h_p^3/[12(1-\mu_p^2)]$ is a bending rigidity of a pavement slab, $E_p$, $\rho_p$ and $h_p$ are respectively a modulus, a density and a thickness of the pavement slab, f(x, y, t) is a traffic load on the pavement slab, and φ(x, y, t) is a reaction force exerted by the base layer on the pavement slab, the flexible pavement and base layer governing equation is $$\begin{cases} G_b u^b_{i,jj} + (\lambda_b + G_b)u^b_{j,ji} = \rho_b \ddot{u}^b_i \\ \tau^b_{ij} = \lambda_b \theta_b \delta_{ij} + 2G_b \varepsilon^b_{ij} \end{cases},$$

wherein $u^b$ is a displacement of an elastic medium layer, $G_b$ and $\lambda_b$ are Lame constants of the elastic medium layer, $\rho_b$ is a density of the elastic medium layer, $\tau^b$ is a stress of the elastic medium layer, $\tau^b$ and $\varepsilon^b$ respectively represent the stress of the elastic medium layer and a strain of the elastic medium layer, and $\delta_{ij}$ is a Kronecker symbol, the unsaturated subgrade governing equation is $$\begin{cases} -p_{w,i} = \rho_w \ddot{u}_i + \frac{\rho_w}{nS_r}\ddot{W}_i + \frac{\rho_w g}{k_w}\dot{W}_i \\ -p_{a,i} = \rho_a \ddot{u}_i + \frac{\rho_a}{n(1-S_r)}\ddot{V}_i + \frac{\rho_a g}{k_a}\dot{V}_i \\ A_{11}\dot{p}_w + A_{12}\dot{p}_a + A_{13}\nabla \cdot \dot{u}_i + A_{14}\nabla \cdot \dot{V}_i = 0 \\ A_{21}\dot{p}_w + A_{22}\dot{p}_a + A_{23}\nabla \cdot \dot{u}_i + A_{24}\nabla \cdot \dot{W}_i = 0 \\ \mu\nabla^2 \ddot{u}_i + (\lambda + G)\nabla e - a\chi\nabla p_w - a(1-\chi)\nabla p_a = \rho\ddot{u}_i + \rho_w\ddot{W}_t + \rho_a\ddot{V}_i \end{cases},$$

wherein $$A_{11} = nA_s + (1-S_r)\frac{a\chi - nS_r}{K_s},$$

$$A_{12} = (1-S_r)\left[\frac{a(1-\chi)-n(1-S_r)}{K_s} + \frac{n}{K_a}\right] - nA_s,$$

$$A_{13} = (1-S_r)\left(1-\frac{K_b}{K_s}\right),$$

$$A_{14} = 1,$$

$$A_{21} = \frac{(a\chi - nS_r)S_r}{K_s} - nA_s + \frac{nS_r}{K_w},$$

$$A_{22} = \frac{[a(1-\chi)-n(1-S_r)]S_r}{K_s} + nA_s,$$

$$A_{23} = \left(1-\frac{K_b}{K_s}\right)S_r,$$

$$A_{24} = 1,$$

$$A_s = -\alpha m d(1-S_{w0})(S_e)^{\frac{m+1}{m}}\left[(S_e)^{-\frac{1}{m}} - 1\right]^{\frac{d-1}{d}},$$

$$a = 1 - K_b/K_s,$$

compressibility moduli of soil skeletons and soil particles respectively, $p_w$ and $p_a$ are pressures of pore water and gas respectively, $\rho_w$ and $\rho_a$ are densities of pore water and gas respectively, $W_i$ and $V_i$ are displacement components of pore water and pore gas relative to soil particles in an i direction, g represents a gravitational acceleration, $k_w$ and $k_a$ represent permeability coefficients of pore water and pore gas respectively, $\chi$ is an effective stress parameter, $\alpha$, m and d are fitting parameters of a soil-water characteristic curve model, $S_e$ is an effective saturation, $S_{w0}$ is an irreducible saturation, n is a soil porosity, and $S_r$ is a saturation;

wherein the processor is further configured to, based on an action form of a vehicle load, respectively set time terms of variables in the rigid pavement governing equation, the flexible pavement and base layer governing equation and the unsaturated subgrade governing equation respectively as a simple harmonic form $e^{i\Omega_0 t}$ and separate the simple harmonic form $e^{i\Omega_0 t}$ of the time terms from the rigid pavement governing equation, the flexible pavement and base layer governing equation, and the unsaturated subgrade governing equation, and then use a double Fourier transform to respectively reduce partial derivatives in a three-dimensional space domain of the rigid pavement governing equation, the flexible pavement and base layer governing equation and the unsaturated subgrade governing equation as ordinary differential equations, to obtain element stiffness matrices of different layer positions after solving and then establish a total dynamic stiffness matrix, wherein the double Fourier transform is $$\bar{f}(\beta, \gamma, z, t) = \int_{-\infty}^{\infty}\int_{-\infty}^{\infty} f(x, y, z, t)e^{-(\beta x+\gamma y)}dxdy,$$

$$f(x, y, z, t) = \frac{1}{4\pi^2}\int_{-\infty}^{\infty}\int_{-\infty}^{\infty} \bar{f}(\beta, \gamma, z, t)e^{i(\beta x+\gamma y)}d\beta d\gamma,$$

wherein $\beta$ and $\gamma$ are wave numbers in x and y directions respectively, and f and $\bar{f}$ are variables in the space domain and a corresponding transform domain respectively, the rigid pavement governing equation in the transform domain is:

$\overline{W}(\beta,\gamma)[D_p(\beta^2+\gamma^2)^2-\Omega^2\rho_p h_p]+\overline{\varphi}(\beta,\gamma)=\bar{f}(\beta,\gamma),$ a stress-strain relationship of the flexible pavement in the transform domain is:

$$\{\overline{\Sigma}_P\} = [S^p][D^p]^{-1}\{\overline{U}_P\} = [K^p]\{\overline{U}_P\},$$

$[D^p] =$ $$\begin{bmatrix} \frac{-i\beta e^{-\alpha_1 h}}{k_1^2} & \frac{-i\beta}{k_1^2} & e^{-\alpha_2 h} & 1 & 0 & 0 \\ \frac{-i\gamma e^{-\alpha_1 h}}{k_1^2} & \frac{-i\gamma}{k_1^2} & 0 & 0 & e^{-\alpha_2 h} & 1 \\ \frac{-i\alpha_1 e^{-\alpha_1 h}}{k_1^2} & \frac{i\alpha_1}{k_1^2} & \frac{\beta}{\alpha_2}e^{-\alpha_2 h} & \frac{-\beta}{\alpha_2} & \frac{\gamma}{\alpha_2}e^{-\alpha_2 h} & \frac{-\gamma}{\alpha_2} \\ \frac{-i\beta}{k_1^2} & \frac{-i\beta e^{-\alpha_1 h}}{k_1^2} & 1 & e^{-\alpha_2 h} & 0 & 0 \\ \frac{-i\gamma}{k_1^2} & \frac{-i\gamma e^{-\alpha_1 h}}{k_1^2} & 0 & 0 & 1 & e^{-\alpha_2 h} \\ \frac{-i\alpha_1}{k_1^2} & \frac{i\alpha_1 e^{-\alpha_1 h}}{k_1^2} & \frac{\beta}{\alpha_2} & \frac{-\beta}{\alpha_2}e^{-\alpha_2 h} & \frac{\gamma}{\alpha_2} & \frac{-\gamma}{\alpha_2}e^{-\alpha_2 h} \end{bmatrix},$$

$$[S^p] = G_p \begin{bmatrix} \frac{2i\beta\alpha_1}{k_1^2}e^{-\alpha_1 h} & -\frac{2i\beta\alpha_1}{k_1^2} & \frac{(\alpha_2^2+\beta^2)}{\alpha_2}e^{-\alpha_2 h} & \frac{(\alpha_2^2+\beta^2)}{\alpha_2} & -\frac{\beta\gamma}{\alpha_2}e^{-\alpha_2 h} & \frac{\beta\gamma}{\alpha_2} \\ \frac{2i\gamma\alpha_1}{k_1^2}e^{-\alpha_1 h} & -\frac{2i\gamma\alpha}{k_1^2} & -\frac{\beta\gamma}{\alpha_2}e^{-\alpha_2 h} & \frac{\beta\gamma}{\alpha_2} & -\frac{(\alpha_2^2+\gamma^2)}{\alpha_2}e^{-\alpha_2 h} & \frac{(\alpha_2^2+\gamma^2)}{\alpha_2} \\ \frac{i(2\alpha_2^2+k_2^2)}{k_1^2}e^{-\alpha_1 h} & \frac{i(2\alpha_2^2+k_2^2)}{k_1^2} & -2\beta e^{-\alpha_2 h} & -2\beta & -2\gamma e^{-\alpha_2 h} & -2\gamma \\ \frac{-2i\beta\alpha_1}{k_1^2} & \frac{2i\beta\alpha_1}{k_1^2}e^{-\alpha_1 h} & \frac{(\alpha_2^2+\beta^2)}{\alpha_2} & \frac{-(\alpha_2^2+\beta^2)}{\alpha_2}e^{-\alpha_2 h} & \frac{\beta\gamma}{\alpha_2} & -\frac{\beta\gamma}{\alpha_2}e^{-\alpha_2 h} \\ \frac{-2i\gamma\alpha_1}{k_1^2} & \frac{2i\gamma\alpha}{k_1^2}e^{-\alpha_1 h} & \frac{\beta\gamma}{\alpha_2} & -\frac{\beta\gamma}{\alpha_2}e^{-\alpha_2 h} & \frac{(\alpha_2^2+\gamma^2)}{\alpha_2} & \frac{-(\alpha_2^2+\gamma^2)}{\alpha_2}e^{-\alpha_2 h} \\ \frac{-i(2\alpha_2^2+k_2^2)}{k_1^2} & \frac{-i(2\alpha_2^2+k_2^2)}{k_1^2}e^{-\alpha_1 h} & 2\beta & 2\beta e^{-\alpha_2 h} & 2\gamma & 2\gamma e^{-\alpha_2 h} \end{bmatrix},$$

wherein superscript 0 of elements in the matrix represents a top surface of a flexible pavement layer, and superscript 1 of elements in the matrix represents a bottom surface of the flexible pavement layer, a stress vector $\{\overline{\Sigma}_P\} = \{-\bar{\tau}_{xz,p}^0 - \bar{\tau}_{yz,p}^0 - i\bar{\tau}_{zz,p}^0 \bar{\tau}_{xz,p}^1 - \bar{\tau}_{yz,p}^1 - i\bar{\tau}_{zz,p}^1\}^T$, $[D^p]$ is a displacement matrix of the flexible pavement, $[S^p]$ is a stress matrix of the flexible pavement, a displacement vector $\{\overline{U}_P\}=\{\bar{u}_{x,p}^0 \ \bar{u}_{y,p}^0 \ i\bar{u}_{z,p}^0 \ \bar{u}_{x,p}^1 \ \bar{u}_{y,p}^1 \ i\bar{u}_{z,p}^1\}^T$, $[K^p]=[S^p][D^p]^{-1}$ is a dynamic stiffness matrix of the flexible pavement layer, $\alpha_1^2=\beta^2+\gamma^2-k_1^2$, $\alpha_2^2=\beta^2+\gamma^2-k_2^2$, $k_1^2=\omega^2/c_1^2$, $k_2^2=\omega^2/c_2^2$, c is a traffic load velocity, $c_1$ and $c_2$ are a compression wave velocity and a shear wave velocity of the elastic medium respectively, $\omega=\Omega_0-\beta c$, h represents a thickness of the flexible pavement layer, and i is an imaginary number, a stress-strain relationship of the elastic base layer in the transform domain is:

$$\{\overline{\Sigma}_b\} = [S^b][D^b]^{-1}\{\overline{U}_b\} = [K^b]\{\overline{U}_b\},$$

a stress-strain relationship of the unsaturated subgrade in the transform domain is:

$$\{\overline{\Sigma}_s\} = [S^s][D^s]^{-1}\{\overline{U}_s\} = [K^s]\{\overline{U}_s\},$$

-continued $$[D^s] = \begin{bmatrix} -\frac{\gamma}{\beta}e^{-\lambda_0 z} & \frac{i\lambda_0}{\beta}e^{-\lambda_0 z} & S_1 i\beta e^{-\lambda_1 z} & S_2 i\beta e^{-\lambda_2 z} & S_3 i\beta e^{-\lambda_3 z} \\ e^{-\lambda_0 z} & 0 & S_1 i\gamma e^{-\lambda_1 z} & S_2 i\gamma e^{-\lambda_2 z} & S_3 i\gamma e^{-\lambda_3 z} \\ 0 & -ie^{-\lambda_0 z} & -iS_1\lambda_1 e^{-\lambda_1 z} & -iS_2\lambda_2 e^{-\lambda_2 z} & -iS_3\lambda_3 e^{-\lambda_3 z} \\ 0 & -\frac{\omega^2}{b^w}e^{-\lambda_0 z} & -\frac{B_{w1}}{b^w \rho_w}e^{-\lambda_1 z} & -\frac{B_{w2}}{b^w \rho_w}e^{-\lambda_2 z} & -\frac{B_{w3}}{b^w \rho_w}e^{-\lambda_3 z} \\ 0 & -\frac{\omega^2}{b^a}e^{-\lambda_0 z} & -\frac{B_{a1}}{b^a \rho_a}e^{-\lambda_1 z} & -\frac{B_{a2}}{b^a \rho_a}e^{-\lambda_2 z} & -\frac{B_{a3}}{b^a \rho_a}e^{-\lambda_3 z} \end{bmatrix},$$

$$[S^s] = \begin{bmatrix} -\frac{\gamma\lambda_0 G}{\beta}e^{-\lambda_0 z} & iG\left(\frac{\lambda_0^2}{\beta}+\beta\right)e^{-\lambda_0 z} & 2GS_1 i\beta\lambda_1 e^{-\lambda_1 z} & 2GS_2 i\beta\lambda_2 e^{-\lambda_2 z} & 2GS_3 i\beta\lambda_3 e^{-\lambda_3 z} \\ G\lambda_0 e^{-\lambda_0 z} & iG\gamma e^{-\lambda_0 z} & 2GS_1 i\gamma\lambda_1 e^{-\lambda_1 z} & 2GS_2 i\gamma\lambda_2 e^{-\lambda_2 z} & 2GS_3 i\gamma\lambda_3 e^{-\lambda_3 z} \\ 0 & -i2G\lambda_0 e^{-\lambda_0 z} & -iB_1 e^{-\lambda_1 z} & -iB_2 e^{-\lambda_2 z} & -iB_3 e^{-\lambda_3 z} \\ 0 & 0 & -f_{w1}e^{-\lambda_1 z} & -f_{w2}e^{-\lambda_2 z} & -f_{w3}e^{-\lambda_3 z} \\ 0 & 0 & -f_{a1}e^{-\lambda_1 z} & -f_{a2}e^{-\lambda_2 z} & -f_{a3}e^{-\lambda_3 z} \end{bmatrix},$$

wherein $$\left\{\overline{\sum}_s\right\} = \{-\overline{\tau}_{xz,s} \ -\overline{\tau}_{yz,s} \ -i\overline{\tau}_{zz,s} \ -\overline{p}_w \ -\overline{p}_a\}^T,$$

$$\{\overline{U}_s\} = \{\overline{u}_{x,s} \ \overline{u}_{y,s} \ i\overline{u}_{z,s} \ \overline{W} \ \overline{V}\}^T,$$

$$B_{wn} = \omega^2 \rho_w S_n \lambda_n - f_{wn}\lambda_n,$$

$$B_{an} = \omega^2 \rho_a S_n \lambda_n - f_{an}\lambda_n,$$

$$B_n = 2\mu S_n \lambda_n^2 + \lambda - a\chi f_{wn} - a(1-\chi)f_{an},$$

$$S_n = -\frac{\lambda + \mu + b_1 f_{wn} + b_2 f_{an}}{b_3 + \mu d_n},$$

$$f_{an} = \frac{b_{13}b_{31} - b_{11}b_{33} + b_{11}d_n}{b_{11}b_{32} - b_{31}b_{12} + b_{31}d_n},$$

$$f_{wn} = \frac{b_{32}b_{23} - b_{22}b_{33} + b_{22}d_n}{b_{22}b_{31} - b_{32}b_{21} + b_{32}d_n},$$

$$\lambda_n = \sqrt{\beta^2 + \gamma^2 + d_n},$$

$d_n$ is roots of an equation $$d_n^3 + b_4 d_n^2 + b_5 d_n + b_6 = 0,$$

$$b_4 = -b_{12} - b_{33} - b_{21},$$

$$b_5 = b_{12}b_{33} - b_{13}b_{32} + b_{21}b_{12} + b_{21}b_{33} - b_{22}b_{11} - b_{23}b_{31},$$

$$b_6 = -b_{21}b_{12}b_{33} - b_{13}b_{31}b_{22} - b_{23}b_{11}b_{32} + b_{21}b_{13}b_{32} + b_{22}b_{11}b_{33} + b_{23}b_{31}b_{12},$$

$n = 1, 2, 3,$ $$b_1 = -a\chi - \frac{\omega^2}{b^w},$$

$$b_2 = -a(1-\chi) - \frac{\omega^2}{b^a},$$

$$b_3 = \rho\omega^2 + \frac{\omega^4 \rho_w}{b^w} + \frac{\omega^4 \rho_a}{b^a},$$

$$b_{11} = b^a \rho_a A_{11}$$

$$b_{12} = b^a \rho_a A_{12},$$

$$b_{13} = \omega^2 \rho_a + b^a \rho_a A_{13},$$

-continued $$b_{21} = b^w \rho_w A_{21},$$

$$b_{22} = b^w \rho_w A_{22},$$

$$b_{23} = \omega^2 \rho_w + b^w \rho_w A_{23},$$

$$b_{31} = -\frac{b_1 b_{21} + b_2 b_{11}}{\lambda + 2\mu},$$

$$b_{32} = -\frac{b_1 b_{22} + b_2 b_{12}}{\lambda + 2\mu},$$

$$b_{33} = -\frac{b_1 b_{23} + b_2 b_{13} + b_3}{\lambda + 2\mu},$$

$$b^w = -\frac{\omega^2}{nS_r} + \frac{i\omega g}{k_w},$$

$$b^a = -\frac{\omega^2}{n(1-S_r)} + \frac{i\omega g}{k_a},$$

a total stiffness matrix of a flexible pavement expressway model is:

$$\{\overline{\Sigma}_f\} = [K_f]\{\overline{U}_f\},$$

wherein $\{\overline{\Sigma}_f\} = \{-\overline{\tau}_{xz,p}^0 \ -\overline{\tau}_{yz,p}^0 \ -i\overline{\tau}_{zz,p}^0 \ 0 \ 0 \ 0 \ 0 \ 0 \ 0 \ 0\}^T$, $\{\overline{U}_f\} = \{\overline{u}_x^0 \ \overline{u}_y^0 \ i\overline{u}_z^0 \ \overline{u}_x^1 \ \overline{u}_y^1 \ i\overline{u}_z^1 \ \overline{u}_x^2 \ \overline{u}_y^2 \ i\overline{u}_z^2 \ \overline{W}^2 \ \overline{V}^2\}^T$, superscripts 0, 1, 2 correspond to different layer positions shown from top to bottom in the three-layered model, and $[K^f]$ is a matrix of 11×11, a total stiffness matrix of a rigid pavement expressway model is:

$$\{\overline{\Sigma}_r\} = [K^r]\{\overline{U}_r\},$$

wherein $\{\overline{\Sigma}_r\} = \{-\overline{\tau}_{xz,b}^1 \ -\overline{\tau}_{yz,b}^1 \ -i\overline{\tau}_{zz,b}^1 \ 0 \ 0 \ 0 \ 0 \ 0\}^T$, $\{\overline{U}_r\} = \{\overline{u}_x^1 \ \overline{u}_y^1 \ i\overline{u}_z^1 \ \overline{u}_x^2 \ \overline{u}_y^2 \ i\overline{u}_z^2 \ \overline{W}^2 \ \overline{V}^2\}^T$, and $[K^r]$ is a matrix of 8×8;

wherein the processor is further configured to determine a load form and a load size according to a specific vehicle, substituting the load form and the load size as boundary conditions into the stiffness matrix of a corresponding model to solve and obtain a solution $\bar{f}$ of a parameter to be solved in a frequency domain, wherein the load form and the load size determined based on the specific vehicle are $$f(x_1, y_1, t) =$$

$$\begin{cases} \dfrac{Pe^{i\Omega_a x}}{4 l_1 l_2} ; \begin{cases} (d_a - l_1) \leq x_1 - Vt \leq (d_a + l_1), (d_w + d_1 - l_2) \leq |y_1| \leq (d_w + d_1 + l_2) \\ (d_a - l_1) \leq x_1 - Vt \leq (d_a + l_1), (d_w - d_1 - l_2) \leq |y_1| \leq (d_w - d_1 + l_2) \\ (-d_a - l_1) \leq x_1 - Vt \leq (-d_a + l_1), (d_w + d_1 - l_2) \leq |y_1| \leq (d_w + d_1 + l_2) \\ (-d_a - l_1) \leq x_1 - Vt \leq (-d_a + l_1), (d_w - d_1 - l_2) \leq |y_1| \leq (d_w - d_1 + l_2) \\ (d_c - l_1) \leq x_1 - Vt \leq (d_c + l_1), (d_w - l_2) \leq |y_1| \leq (d_w + l_2) \end{cases} \\ 0; \text{others} \end{cases}$$

wherein P represents a total axle load of the specific vehicle, and in a moving coordinate system, $x=x_1-Vt$, $y=y_1$, $z=z_1$, wherein in the transform domain, the load form and the load size determined based on the specific vehicle are $$\bar{f}(\beta, \gamma) = \dfrac{P(e^{-i\gamma d_w} + e^{i\gamma d_w})}{10 l_1 l_2 \beta \gamma} [$$
$$\sin(\beta l_1)\sin(\gamma l_2) e^{-i\beta d_c} + \sin(\beta l_1)\sin(\gamma l_2)(e^{-i\beta d_a} + e^{i\beta d_a})(e^{-i\gamma d_t} + e^{i\gamma d_t})],$$

a boundary condition of the rigid pavement expressway model is:

$$\begin{cases} \tau^1_{zz,b}(x, y, t) = -\varphi(x, y, t) \\ \tau^1_{xz,b}(x, y, t) = \tau^1_{yz,b}(x, y, t) = p^2_w(x, y, t) = p^2_a(x, y, t) = 0, \\ u^1_{zz,b}(x, y, t) = W(x, y, t) \end{cases}$$

the boundary condition of the rigid pavement expressway model with the time term $e^{i\Omega_0 t}$ removed is expressed as:

$$\begin{cases} \bar{\tau}^1_{zz,b}(\beta, \gamma) = -\bar{\varphi}(\beta, \gamma) \\ \bar{\tau}^1_{xz,b}(\beta, \gamma) = \bar{\tau}^1_{yz,b}(\beta, \gamma) = \bar{p}^2_w(\beta, \gamma) = \bar{p}^2_a(\beta, \gamma) = 0, \\ \bar{u}^1_{zz,b}(\beta, \gamma) = \bar{W}(\beta, \gamma) \end{cases}$$

wherein $$\bar{\varphi}(\beta, \gamma) = \dfrac{\bar{f}(\beta, \gamma)}{1 + B_{33} D_P (\beta^2 + \gamma^2)^2 - B_{33} \omega^2 m_b},$$

and $B_{33}$ is an element in a third row and a third column of $[K']^{-1}$ and corresponds to a vertical displacement of the base layer, a boundary condition of the flexible pavement expressway model is:

$$\begin{cases} \tau^0_{zz,p}(x, y, t) = f(x, y, t) \\ \tau^0_{xz}(x, y, t) = \tau^0_{yz}(x, y, t) = p^2_w(x, y, t) = p^2_a(x, y, t) = 0 \end{cases},$$

the boundary condition of the flexible pavement expressway model with the time term $e^{i\Omega_0 t}$ removed is expressed as:

$$\begin{cases} \bar{\tau}^0_{zz,p}(\beta, \gamma) = \bar{f}(\beta, \gamma) \\ \bar{\tau}^0_{xz}(\beta, \gamma) = \bar{\tau}^0_{yz}(\beta, \gamma) = \bar{p}^2_w(\beta, \gamma) = \bar{p}^2_a(\beta, \gamma) = 0 \end{cases},$$

wherein for the rigid pavement expressway model, the corresponding boundary condition is substituted into the total stiffness matrix of the rigid pavement expressway model, and for the flexible pavement expressway model, the corresponding boundary condition is substituted into the total stiffness matrix of the flexible pavement expressway model, in such a way to obtain the displacement of each surface, the displacement $\{\bar{u}_x^2 \ \bar{u}_y^2 \ i\bar{u}_z^2 \ \bar{W}^2 \ \bar{V}^2\}$ of the top surface of the subgrade is substituted into the stress-strain relationship of the unsaturated subgrade in the transform domain to obtain a stress $\{\bar{\tau}_{xz,s} \ \bar{\tau}_{yz,s} \ \bar{\tau}_{zz,s} \ \bar{p}_w \ \bar{p}_\alpha\}$ and a displacement $\{\bar{u}_x^2 \ \bar{u}_y^2 \ \bar{u}_z^2 \ \bar{W}^2 \ \bar{V}^2\}$ at any position inside the subgrade in the frequency domain, and a vibration velocity $\bar{v}_{ij} = i\omega \bar{u}_{ij}$ and an acceleration $\bar{a}_{ij} = \omega^2 \bar{u}_{ij}$ of the subgrade can be calculated according to the displacement;

wherein the processor is further configured to use an inverse fast Fourier transform to convert the solution $\bar{f}$ of the parameter to be solved in the frequency domain into a solution f in the time domain, wherein the solution f in the time domain is a stress $\{\tau_{xz,s} \ \tau_{yz,s} \ \tau_{zz,s} \ p_w \ p_\alpha\}$, a displacement $\{u^2_x \ u^2_y \ u^2_z \ W^2 \ V^2\}$, a velocity $v_{ij}$ and an acceleration $a_{ij}$.

In combination of the second aspect of the present disclosure, in the first possible implementation mode according to the second aspect of the present disclosure, the processor is further configured to:

acquire a task of determining the performance of the subgrade of the target expressway section.

In combination of the first possible implementation mode according to the second aspect of the present disclosure, in the second possible implementation mode according to the second aspect of the present disclosure, the processor is specifically configured to:

monitor whether project data on a system are updated; and in response to monitoring that the project data are updated, acquire the task of determining the performance of the subgrade of the target expressway section based on the updated project data.

In combination of the first possible implementation mode according to the second aspect of the present disclosure, in the third possible implementation mode according to the second aspect of the present disclosure, the processor is specifically configured to:

receive the task of determining the performance of the subgrade of the target expressway section as inputted by a user.

In combination of the second aspect of the present disclosure, in the fourth possible implementation mode according to the second aspect of the present disclosure, the processor further configured to:

output the solution f in the time domain.

In combination of the fourth possible implementation mode according to the second aspect of the present disclosure, in the fifth possible implementation mode according to the second aspect of the present disclosure, the processor is specifically configured to:

output a performance determination report of the subgrade of the target expressway section, wherein the performance determination report includes the solution f in the time domain.

In combination of the second aspect of the present disclosure, in the sixth possible implementation mode according to the second aspect of the present disclosure, the processor is further configured to:

determine whether a value of the solution f in the time domain reaches a predetermined alarm value; and in response to determining the value of the solution f in the time domain reaches the predetermined alarm value, output an alarm prompt.

In a third aspect, the present disclosure provides a computer readable storage medium which stores a plurality of instructions that are suitable to be loaded by the processor to execute the method provided in the first aspect of the present disclosure or in any possible implementation mode according to the first aspect of the present disclosure.

From the above contents, it can be known that the present disclosure has the following advantageous effects:

It can be seen from the above contents that the present disclosure analyzes the performance of the subgrade of an expressway from the construction of the structural model of the expressway to the derivation of the dynamic governing equations, then removes time terms in the dynamic governing equations and constructs the corresponding dynamic stiffness matrices through the double Fourier transform, and then introduces boundary conditions to continue to solve the dynamic stiffness matrices, and finally converts the parameter solution results in the frequency domain into the parameter solution results in the time domain through the inverse fast Fourier transform, in such a way to accurately calculate the stress, displacement, velocity and acceleration at any position inside the subgrade while analyzing the performance of the subgrade of the target expressway section, in full consideration of the moving speed and vibration characteristics of the vehicle load, the layered characteristics of the expressway and the unsaturated characteristics of the subgrade soil, thereby providing a strong data support for the development of the project.

BRIEF DESCRIPTION OF THE DRAWINGS

In order to illustrate the technical solutions of the embodiments of the present disclosure more clearly, the drawings used in the description of the embodiments will be briefly introduced. Obviously, the drawings in the following description are merely some embodiments of the present disclosure. For those skilled in the art, other drawings can also be obtained from these drawings without creative labor.

DETAILED DESCRIPTION

Figure 1:
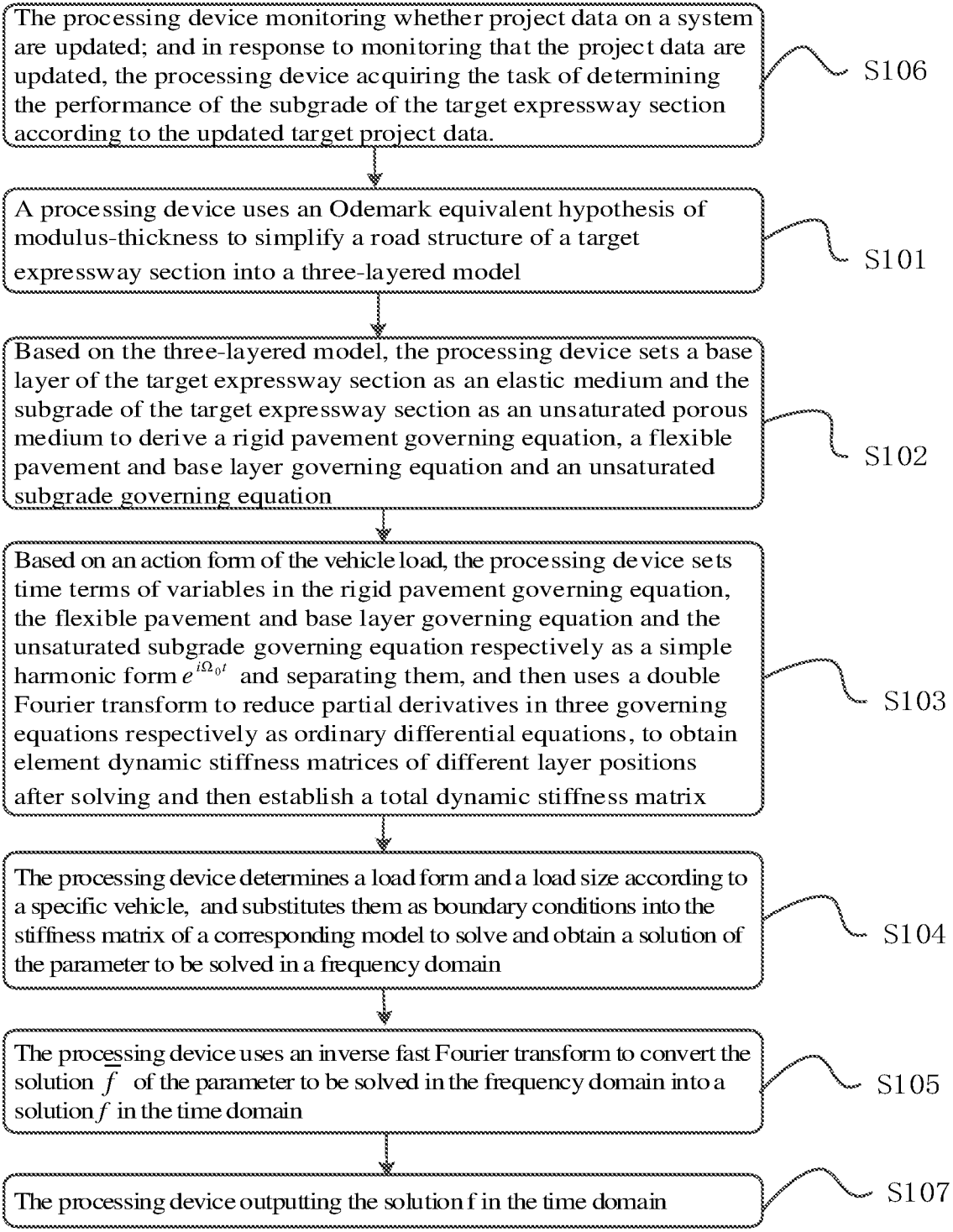
FIG. 1 shows a flow chart schematic view of a method for determining a performance of an unsaturated subgrade of a multi-layered expressway section of the present disclosure.

The technical solutions in the embodiments of the present disclosure will be clearly and completely described below with reference to the drawings in the embodiments of the present disclosure. Obviously, the described embodiments are only a part, but not all of the embodiments of the present disclosure. Based on the embodiments in the present disclosure, all other embodiments obtained by those skilled in the art without creative work shall fall within the scope of protection of the present disclosure.

The terms "first", "second", etc. in the description and claims, as well as the drawings, of the present disclosure are used to distinguish similar objects, and not necessarily used to describe a specific order or sequence. It should be understood that the data so used can be interchanged where appropriate, so that the embodiments described herein can be implemented in an order other than what is illustrated or described herein. In addition, the terms "comprise" and "have" and any variations thereof are intended to cover non-exclusive inclusion. For example, a process, method, system, product or device that comprises a series of steps or modules are not limited to those steps or modules that are clearly listed, but can include other steps or modules that are not clearly listed or are inherent to these processes, methods, products or devices. The naming or numbering of steps in the present disclosure does not mean that the steps in the process flow must be executed according to the time/logical order indicated by the naming or numbering. The execution order of the named or numbered process steps can be changed according to the technical purpose to be achieved, as long as the same or similar technical effects can be achieved.

The division of modules in the present disclosure is a logical division. There can be another division manner in practical application, for example, a plurality of modules can be combined or integrated in another system, or some features can be ignored or not implemented. In addition, the mutual coupling or direct coupling or communication connection between the displayed or discussed modules can be realized through some interfaces, or the indirect coupling or communication connection between modules can be electrical or other similar forms, which are not limited in the present disclosure. In addition, the modules or sub-modules described as separate components can be or can not be physically separated, can be or can not be physical modules, or can be distributed to a plurality of circuit modules, and some or all of them can be selected according to actual needs to achieve the purpose of the solution of the present disclosure.

Before introducing the method for determining a performance of an unsaturated subgrade of a multi-layered expressway section provided by the present disclosure, the background art involved in the present disclosure shall be introduced first.

The method and the apparatus for determining a performance of an unsaturated subgrade of a multi-layered expressway section, as well as the computer readable storage medium, provided by the present disclosure are applicable to the processing device, which are used to accurately calculate the stress, displacement, velocity and acceleration at any position inside the subgrade while analyzing the performance of the subgrade of the target expressway section, in full consideration of the moving speed and vibration characteristics of the vehicle load, the layered characteristics of the expressway and the unsaturated characteristics of the subgrade soil.

The subject for executing the method for determining a performance of an unsaturated subgrade of a multi-layered expressway section mentioned in the present disclosure can be an apparatus for determining the performance of the subgrade of the expressway section, or different types of processing devices such as servers, physical hosts or user equipment (UE) integrating the apparatus for determining the performance of the subgrade of the expressway section, wherein the apparatus for determining the performance of the subgrade of the expressway section can be implemented in the form of hardware or software, UE can specifically be a terminal device such as a smart phone, tablet, laptop, desktop computer or personal digital assistant (PDA), and the processing device can be arranged in the form of device cluster.

The method for determining a performance of an unsaturated subgrade of a multi-layered expressway section provided by the present disclosure will be introduced.

First, with reference to FIG. 1, it shows a flow chart schematic view of a method for determining a performance of an unsaturated subgrade of a multi-layered expressway section of the present disclosure. The method for determining the performance of the subgrade of the expressway section provided by the present disclosure can specifically include the following steps.

In step S101: an Odemark equivalent hypothesis of modulus-thickness is used by a processing device to simplify a road structure of a target expressway section into a three-layered model, wherein the three-layered model is $$H_e = \left(\frac{E}{E_1}\right)^{1/3} H \quad (1)$$

wherein $H_e$ is an equivalent thickness, E is a modulus of a layer to be transformed, H is a thickness of the layer to be transformed, and $E_1$ is a modulus of a target layer.

Figure 2:
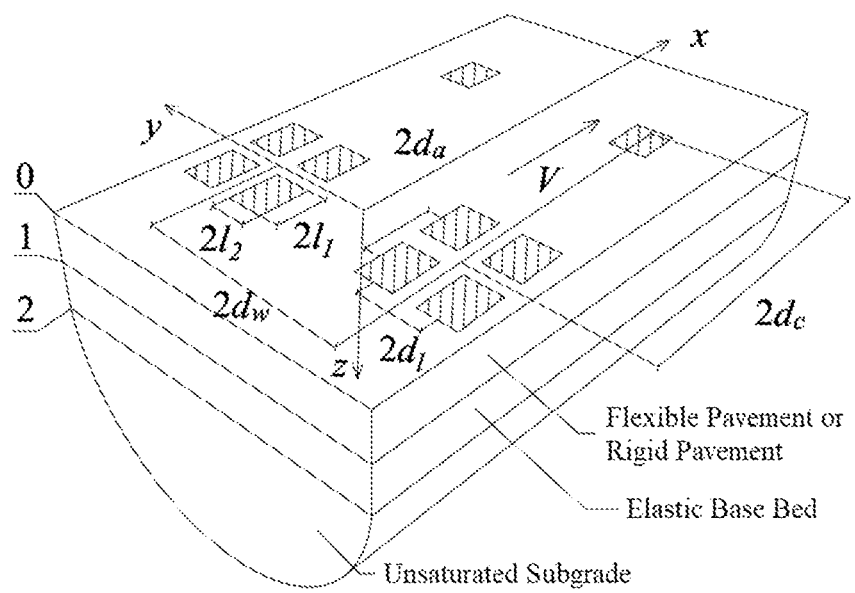
FIG. 2 shows a structural schematic view of an expressway model of the present disclosure.

It can be understood that reference can be made to a structural schematic view of an expressway model of the present disclosure as shown in FIG. 2. In the present disclosure, as compared with the prior art which simply simplifies an expressway into a layered elastic medium, the present disclosure will select a flexible pavement or a rigid pavement based on the design scheme or actual situation of the expressway to construct a fine road structural model with the assumption that the base layer is an elastic medium and the subgrade is an unsaturated porous medium, which provides a solid foundation for subsequent detailed performance analysis.

In step S102: based on the three-layered model, a base layer of the target expressway section is set as an elastic medium and the subgrade of the target expressway section is set as an unsaturated porous medium, by the processing device, to derive and obtain a rigid pavement governing equation, a flexible pavement and base layer governing equation, and an unsaturated subgrade governing equation, wherein the rigid pavement governing equation is:

$$D_p\left[\frac{\partial^4 W(x,y,t)}{\partial x^4} + 2\frac{\partial^4 W(x,y,t)}{\partial x^2 \partial y^2} + \frac{\partial^4 W(x,y,t)}{\partial y^4}\right] + \rho_p h_p \ddot{W}(x,y,t) + \varphi(x,y,t) = f(x,y,t) \quad (2)$$

wherein $D_p = E_p h_p^3/[12(1-\mu_p^2)]$ is a bending rigidity of a pavement slab, W(x, y, t) is a vertical displacement of the pavement slab, $E_p$, $\rho_p$ and $h_p$ are respectively a modulus, a density and a thickness of the pavement slab, f(x, y, t) is a traffic load on the pavement slab, and $\varphi(x, y, t)$ is a reaction force exerted by the base layer on the pavement slab.

It can be understood that in the present disclosure, the function (·) represents the derivation with respect to time, and also corresponds to the relevant processing of the time terms in the subsequent contents.

The flexible pavement and base layer governing equation is $$\begin{cases} G_b u_{i,jj}^b + (\lambda_b + G_b)u_{j,ji}^b = \rho_b \ddot{u}_t^b \\ \tau_{ij}^b = \lambda_b \theta_b \delta_{ij} + 2G_b \varepsilon_{ij}^b \end{cases} \quad (3)$$

wherein $u^b$ is a displacement of an elastic medium layer, $G_b$ and $\lambda_b$ are Lame constants of the elastic medium layer, $\rho_b$ is a density of the elastic medium layer, $\tau^b$ is a stress of the elastic medium layer, $\tau^b$ and $e^b$ respectively represent the stress of the elastic medium layer and a strain of the elastic medium layer, and $\delta_{ij}$ is a Kronecker symbol, the unsaturated subgrade governing equation is $$\begin{cases} -p_{w,i} = \rho_w \ddot{u}_i + \frac{\rho_w}{nS_r}\ddot{W}_t + \frac{\rho_w g}{k_w}\dot{W}_i \\ -p_{a,i} = \rho_a \ddot{u}_i + \frac{\rho_a}{n(1-S_r)}\ddot{V}_i + \frac{\rho_a g}{k_a}\dot{V}_i \\ A_{11}\dot{p}_w + A_{12}\dot{p}_a + A_{13}\nabla \cdot \dot{u}_i + A_{14}\nabla \cdot \dot{V}_i = 0 \\ A_{21}\dot{p}_w + A_{22}\dot{p}_a + A_{23}\nabla \cdot \dot{u}_i + A_{24}\nabla \cdot \dot{W}_i = 0 \\ \mu\nabla^2 u_t + (\lambda+G)\nabla e - a\chi\nabla p_w - a(1-\chi)\nabla p_a = \rho\ddot{u}_t + \rho_w\ddot{W}_t + \rho_a\ddot{V}_t \end{cases} \quad (4)$$

wherein $$A_{11} = nA_s + (1-S_r)\frac{a\chi - nS_r}{K_s},$$

$$A_{12} = (1-S_r)\left[\frac{a(1-\chi)-n(1-S_r)}{K_s} + \frac{n}{K_a}\right] - nA_s,$$

$$A_{13} = (1-S_r)\left(1-\frac{K_b}{K_s}\right),$$

$$A_{14} = 1,$$

$$A_{21} = \frac{(a\chi - nS_r)S_r}{K_s} - nA_s + \frac{nS_r}{K_w},$$

$$A_{22} = \frac{([a(1-\chi)-n(1-S_r)]S_r}{(K_s)} + nA_s,$$

$$A_{23} = \left(1-\frac{K_b}{K_s}\right)S_r,$$

$$A_{24} = 1,$$

$$A_s = -\alpha m d(1-S_w 0)(S_e)^{\frac{m+1}{m}}\left[(S_e)^{-\frac{1}{m}} - 1\right]^{\frac{d-1}{d}},$$

$$a = 1 - K_b/K_s, K_b \text{ and } K_s$$

are bulk compressibility moduli of soil skeletons and soil particles respectively, $p_w$ and $p_a$ are pressures of pore water and gas respectively, $\rho_w$ and $\rho_a$ are densities of pore water and gas respectively, $W_i$ and $V_i$ are displacement components of pore water and pore gas relative to soil particles in the i direction, g represents a gravitational acceleration, $k_w$ and $k_a$ represent permeability coefficients of pore water and pore gas respectively, x is an effective stress parameter, α, m and d are fitting parameters of a soil-water characteristic curve model, $S_e$ is an effective saturation, $S_{w0}$ is an irreducible saturation, n is a soil porosity, and $S_r$ is a saturation.

It should be noted herein that in the governing equation (4), the present disclosure introduces an important input index, namely the soil saturation $S_r$, and deems that the change of the saturation can have a significant impact on the dynamic response of the overall structure. Thus, the introduction of the saturation $S_r$ can facilitate the analysis and processing of the entire performance, and draw attention to the impact of the change of water-containing state inside the subgrade on the overall structure.

Furthermore, as for the governing equation (4), it can be seen that the equation relates to parameters of three aspects, i.e., solid, liquid and gas inside soil, thereby drawing attention to the effect of the coupling between solid, liquid and gas phases in soil, and to the multiphase of soil which is missed in the prior art.

$$\bar{f}(\beta, \gamma, z, t) = \int_{-\infty}^{\infty}\int_{-\infty}^{\infty} f(x, y, z, t) e^{-i(\beta x + \gamma y)} dx dy,$$

$$f(x, y, z, t) = \frac{1}{4\pi^2}\int_{-\infty}^{\infty}\int_{-\infty}^{\infty} \bar{f}(\beta, \gamma, z, t) e^{i(\beta x + \gamma y)} d\beta d\gamma,$$

wherein $\beta$ and $\gamma$ are wave numbers in x and y directions respectively, and f and $\bar{f}$ are variables in the space domain and corresponding transform domain respectively, the rigid pavement governing equation in the transform domain is:

$$\bar{W}(\beta,\gamma)[D_p(\beta^2+\gamma^2)^2 - \Omega^2\rho_p h_p] + \bar{\varphi}(\beta,\gamma) = \bar{f}(\beta,\gamma) \tag{5}$$

a stress-strain relationship of the flexible pavement in the transform domain is:

$$\{\bar{\Sigma}_P\} = [S^p][D^p]^{-1}\{\bar{U}_P\} = [K^p]\{\bar{U}_P\} \tag{6}$$

$$[D^p] = \begin{bmatrix} \frac{-i\beta e^{-\alpha_1 h}}{k_1^2} & \frac{-i\beta}{k_1^2} & e^{-\alpha_2 h} & 1 & 0 & 0 \\ \frac{-i\gamma e^{-\alpha_1 h}}{k_1^2} & \frac{-i\gamma}{k_1^2} & 0 & 0 & e^{-\alpha_2 h} & 1 \\ \frac{-i\alpha_1 e^{-\alpha_1 h}}{k_1^2} & \frac{i\alpha_1}{k_1^2} & \frac{\beta}{\alpha_2}e^{-\alpha_2 h} & \frac{-\beta}{\alpha_2} & \frac{\gamma}{\alpha_2}e^{-\alpha_2 h} & \frac{-\gamma}{\alpha_2} \\ \frac{-i\beta}{k_1^2} & \frac{-i\beta e^{-\alpha_1 h}}{k_1^2} & 1 & e^{-\alpha_2 h} & 0 & 0 \\ \frac{-i\gamma}{k_1^2} & \frac{-i\gamma e^{-\alpha_1 h}}{k_1^2} & 0 & 0 & 1 & e^{-\alpha_2 h} \\ \frac{-i\alpha_1}{k_1^2} & \frac{i\alpha_1 e^{-\alpha_1 h}}{k_1^2} & \frac{\beta}{\alpha_2} & \frac{-\beta}{\alpha_2}e^{-\alpha_2 h} & \frac{\gamma}{\alpha_2} & \frac{-\gamma}{\alpha_2}e^{-\alpha_2 h} \end{bmatrix},$$

$$[S^p] = G_p \begin{bmatrix} \frac{2i\beta\alpha_1}{k_1^2}e^{-\alpha_1 h} & -\frac{2i\beta\alpha_1}{k_1^2} & -\frac{(\alpha_2^2+\beta^2)}{\alpha_2}e^{-\alpha_2 h} & \frac{(\alpha_2^2+\beta^2)}{\alpha_2} & -\frac{\beta\gamma}{\alpha_2}e^{-\alpha_2 h} & \frac{\beta\gamma}{\alpha_2} \\ \frac{2i\gamma\alpha_1}{k_1^2}e^{-\alpha_1 h} & -\frac{2i\gamma\alpha_1}{k_1^2} & -\frac{\beta\gamma}{\alpha_2}e^{-\alpha_2 h} & \frac{\beta\gamma}{\alpha_2} & -\frac{(\alpha_2^2+\gamma^2)}{\alpha_2}e^{-\alpha_2 h} & \frac{(\alpha_2^2+\gamma^2)}{\alpha_2} \\ \frac{i(2\alpha^2+k_2^2)}{k_1^2}e^{-\alpha_1 h} & \frac{i(2\alpha^2+k_2^2)}{k_1^2} & -2\beta e^{-\alpha_2 h} & -2\beta & -2\gamma e^{-\alpha_2 h} & -2\gamma \\ \frac{-2i\beta\alpha_1}{k_1^2} & \frac{2i\beta\alpha_1}{k_1^2}e^{-\alpha_1 h} & \frac{(\alpha_2^2+\beta^2)}{\alpha_2} & \frac{-(\alpha_2^2+\beta^2)}{\alpha_2}e^{-\alpha_2 h} & \frac{\beta\gamma}{\alpha_2} & -\frac{\beta\gamma}{\alpha_2}e^{-\alpha_2 h} \\ \frac{-2i\gamma\alpha_1}{k_1^2} & \frac{2i\gamma\alpha_1}{k_1^2}e^{-\alpha_1 h} & \frac{\beta\gamma}{\alpha_2} & -\frac{\beta\gamma}{\alpha_2}e^{-\alpha_2 h} & \frac{(\alpha_2^2+\gamma^2)}{\alpha_2} & -\frac{(\alpha_2^2+\gamma^2)}{\alpha_2}e^{-\alpha_2 h} \\ \frac{-i(2\alpha_2^2+k_2^2)}{k_1^2} & \frac{-i(2\alpha_2^2+k_2^2)}{k_1^2}e^{-\alpha_1 h} & 2\beta & 2\beta e^{-\alpha_2 h} & 2\gamma & 2\gamma e^{-\alpha_2 h} \end{bmatrix},$$

In step S103: based on an action form of a vehicle load, time terms of variables in the rigid pavement governing equation, the flexible pavement and base layer governing equation and the unsaturated subgrade governing equation are respectively set as a simple harmonic form $e^{i\Omega_0 t}$ and separated them from the rigid pavement governing equation, the flexible pavement and base layer governing equation and the unsaturated subgrade governing equation by the processing device, and then a double Fourier transform is used by the processing device to respectively reduce partial derivatives in a three-dimensional space domain of the rigid pavement governing equation, the flexible pavement and base layer governing equation and the unsaturated subgrade governing equation as ordinary differential equations, to obtain element stiffness matrices of different layer positions after solving and then establish a total dynamic stiffness matrix, wherein the double Fourier transform is wherein superscript 0 of elements in the matrix represents a top surface of a flexible pavement layer, and superscript 1 of elements in the matrix represents a bottom surface of the flexible pavement layer, a stress vector $\{\bar{\Sigma}_P\} = \{-\bar{\tau}_{xz,p}{}^0 -\bar{\tau}_{yz,p}{}^0 -i\bar{\tau}_{zz,p}{}^0 \bar{\tau}_{xz,p}{}^1 -\bar{\tau}_{yz,p}{}^1 -i\bar{\tau}_{zz,p}{}^1\}^T$, $[D^p]$ is a displacement matrix of the flexible pavement, $[S^p]$ is a stress matrix of the flexible pavement, a displacement vector $\{\bar{U}_P\} = \{\bar{u}_{x,p}{}^0 \bar{u}_{y,p}{}^0 i\bar{u}_{z,p}{}^0 \bar{u}_{x,p}{}^1 \bar{u}_{y,p}{}^1 i\bar{u}_{z,p}{}^1\}^T$, $[K^p] = [S^p][D^p]^{-1}$ s a dynamic stiffness matrix of the flexible pavement layer, $\alpha_1{}^2 = \beta^2 + \gamma^2 - k_1{}^2$, $\alpha_2{}^2 = \beta^2 + \gamma^2 - k_2{}^2$, $k_1{}^2 = \omega^2/c_1{}^2$, $k_2{}^2 = \omega^2/c_2{}^2$, c is a traffic load velocity, $c_1$ and $c_2$ are a compression wave velocity and a shear wave velocity of the elastic medium respectively, $\omega = \Omega_0 - \beta c$, h represents a thickness of the flexible pavement layer, and i is an imaginary number, a stress-strain relationship of the elastic base layer in the transform domain is:

$$\{\bar{\Sigma}_b\} = [S^b][D^b]^{-1}\{\bar{U}_b\} = [K^b]\{\bar{U}_b\} \tag{7}$$

a stress-strain relationship of the unsaturated subgrade in the transform domain is:

$$\{\textstyle\sum_s\} = [S^s][D^s]^{-1}\{\overline{U}_s\} = [K^s]\{\overline{U}_s\} \tag{8}$$

$$[D^s] = \begin{bmatrix} -\dfrac{\gamma}{\beta}e^{-\lambda_0 z} & \dfrac{i\lambda_0}{\beta}e^{-\lambda_0 z} & S_1 i\beta e^{-\lambda_1 z} & S_2 i\beta e^{-\lambda_2 z} & S_3 i\beta e^{-\lambda_3 z} \\ e^{-\lambda_0 z} & 0 & S_1 i\gamma e^{-\lambda_1 z} & S_2 i\gamma e^{-\lambda_2 z} & S_3 i\gamma e^{-\lambda_2 z} \\ 0 & -ie^{-\lambda_0 z} & -iS_1\lambda_1 e^{-\lambda_1 z} & -iS_2\lambda_2 e^{-\lambda_1 z} & -iS_3\lambda_3 e^{-\lambda_3 z} \\ 0 & -\dfrac{\omega^2}{b^w}e^{-\lambda_0 z} & -\dfrac{B_{w1}}{b^w\rho_w}e^{-\lambda_1 z} & -\dfrac{B_{w2}}{b^w\rho_w}e^{-\lambda_2 z} & -\dfrac{B_{w3}}{b^w\rho_w}e^{-\lambda_3 z} \\ 0 & -\dfrac{\omega^2}{b^a}e^{-\lambda_0 z} & -\dfrac{B_{a1}}{b^a\rho_a}e^{-\lambda_1 z} & -\dfrac{B_{a2}}{b^a\rho_a}e^{-\lambda_2 z} & -\dfrac{B_{a3}}{b^a\rho_a}e^{-\lambda_3 z} \end{bmatrix},$$

$$[S^s] = \begin{bmatrix} -\dfrac{\gamma\lambda_0 G}{\beta}e^{-\lambda_0 z} & iG\left(\dfrac{\lambda_0^2}{\beta}+\beta\right)e^{-\lambda_0 z} & 2GS_1 i\beta\lambda_1 e^{-\lambda_1 z} & 2GS_2 i\beta\lambda_2 e^{-\lambda_2 z} & 2GS_3 i\beta\lambda_3 e^{-\lambda_3 z} \\ G\lambda_0 e^{-\lambda_0 z} & iG\gamma e^{-\lambda_0 z} & 2GS_1 i\gamma\lambda_1 e^{-\lambda_2 z} & 2GS_2 i\gamma\lambda_2 e^{-\lambda_2 z} & 2GS_3 i\gamma\lambda_3 e^{-\lambda_3 z} \\ 0 & -i2G\lambda_0 e^{-\lambda_0 z} & -iB_1 e^{-\lambda_1 z} & -iB_2 e^{-\lambda_2 z} & -iB_3 e^{-\lambda_3 z} \\ 0 & 0 & -f_{w1}e^{-\lambda_1 z} & -f_{w2}e^{\lambda_2 z} & -f_{w3}e^{-\lambda_3 z} \\ 0 & 0 & -f_{a1}e^{-\lambda_1 z} & -f_{a2}e^{\lambda_2 z} & -f_{a3}e^{-\lambda_3 z} \end{bmatrix},$$

wherein $$\{\textstyle\sum_s\} = \{-\overline{\tau}_{xz,s}\ -\overline{\tau}_{yz,s}\ -i\overline{\tau}_{zz,s}\ -\overline{p}_w\ -\overline{p}_a\}^T,$$

$$\{\overline{U}_s\} = \{\overline{u}_{x,s}\ \overline{u}_{y,s}\ i\overline{u}_{z,s}\ \overline{W}\ \overline{V}\}^T,$$

$$B_{wn} = \omega^2\rho_w S_n\lambda_n - f_{wn}\lambda_n,$$

$$B_{an} = \omega^2\rho_a S_n\lambda_n - f_{an}\lambda_n,$$

$$B_n = 2\mu S_n\lambda_n^2 + \lambda - a\chi f_{wn} - a(1-\chi)f_{an},$$

$$S_n = -\dfrac{\lambda + \mu + b_1 f_{wn} + b_2 f_{an}}{b_3 + \mu d_n},$$

$$f_{an} = \dfrac{(b_{13}b_{31} - b_{11}b_{33} + b_{11}d_n)}{(b_{11}b_{32} - b_{31}b_{12} + b_{31}d_n)},$$

$$f_{wn} = \dfrac{(b_{32}b_{23} - b_{22}b_{33} + b_{22}d_n)}{(b_{22}b_{31} - b_{32}b_{21} + b_{32}d_n)},$$

$$\lambda_n = \sqrt{\beta^2 + \gamma^2 + d_n},\ d_n$$

is roots of the equation $$d_n^3 + b_4 d_n^2 + b_5 d_n + b_6 = 0,$$

$$b_4 = -b_{12} - b_{33} - b_{21},$$

$$b_5 = b_{12}b_{33} - b_{13}b_{32} + b_{21}b_{12} + b_{21}b_{33} - b_{22}b_{11} - b_{23}b_{31}$$

$$b_6 = -b_{21}b_{12}b_{33} - b_{13}b_{31}b_{22} - b_{23}b_{11}b_{32} + b_{21}b_{13}b_{32} + b_{22}b_{11}b_{33} + b_{23}b_{31}b_{12},$$

$$n = 1, 2, 3,\ b_1 = -\alpha\chi - \dfrac{\omega^2}{b^w},$$

$$b_2 = (1-\chi) - \dfrac{\omega^2}{b^a},$$

$$b_3 = \rho\omega^2 + \dfrac{\omega^4\rho_w}{b^w} + \dfrac{\omega^4\rho_a}{b^a},$$

$$b_{11} = b^a\rho_a A_{11},$$

$$b_{12} = b^a\rho_a A_{12},$$

$$b_{13} = \omega^2\rho_a + b^a\rho_a A_{13},$$

$$b_{21} = b^w\rho_w A_{21},$$

$$b_{22} = b^w\rho_w A_{22},$$

$$b_{23} = \omega^2\rho_w + b^w\rho_w A_{23},$$

$$b_{31} = -\dfrac{b_1 b_{21} + b_2 b_{11}}{\lambda + 2\mu},$$

$$b_{32} = -\dfrac{b_1 b_{22} + b_2 b_{12}}{\lambda + 2\mu},$$

$$b_{33} = -\dfrac{b_1 b_{23} + b_2 b_{13} + b_3}{\lambda + 2\mu},$$

$$b^w = -\dfrac{\omega^2}{nS_r} + \dfrac{i\omega g}{k_w},$$

$$b^a = -\dfrac{\omega^2}{n(1-S_r)} + \dfrac{i\omega g}{k_a},$$

a total stiffness matrix of a flexible pavement expressway model is:

$$\{\overline{\textstyle\sum}_f\} = [K^f]\{\overline{U}_f\} \tag{9}$$

wherein $\{\overline{\textstyle\sum}_f\} = \{-\overline{\tau}_{xz,p}^{\ 0}\ -\overline{\tau}_{yz,p}^{\ 0}\ -i\overline{\tau}_{zz,p}^{\ 0}\ 0\ 0\ 0\ 0\ 0\ 0\ 0\}^T$, $\{\overline{U}_f\} = \{\overline{u}_x^{\ 0}\ \overline{u}_y^{\ 0}\ i\overline{u}_z^{\ 0}\ \overline{u}_x^{\ 1}\ \overline{u}_y^{\ 1}\ i\overline{u}_z^{\ 1}\ \overline{u}_x^{\ 2}\ \overline{u}_y^{\ 2}\ i\overline{u}_z^{\ 2}\ \overline{W}^2\ \overline{V}^2\}^T$, superscripts 0, 1, 2 correspond to different layer positions shown from top to bottom in the three-layered model (the model structure as shown in FIG. 2), and $[K^f]$ is a matrix of 11×11, a total stiffness matrix of a rigid pavement expressway model is:

$$\{\overline{\textstyle\sum}_r\} = [K^r]\{\overline{U}_r\} \tag{10}$$

wherein $\{\overline{\textstyle\sum}_r\} = \{-\overline{\tau}_{xz,b}^{\ 1}\ -\overline{\tau}_{yz,b}^{\ 1}\ -i\overline{\tau}_{zz,b}^{\ 1}\ 0\ 0\ 0\ 0\ 0\}^T$, $\{\overline{U}_r\} = \{\overline{u}_x^{\ 1}\ \overline{u}_y^{\ 1}\ i\overline{u}_z^{\ 1}\ \overline{u}_x^{\ 2}\ \overline{u}_y^{\ 2}\ i\overline{u}_z^{\ 2}\ \overline{W}^2\ \overline{V}^2\}^T$, and $[K^r]$ is a matrix of 8×8;

It can be understood that the construction of the stiffness matrix is used to provide the analysis unit of finite elements for subsequent performance analysis.

In step S104: a load form and a load size are determined by the processing device according to a specific vehicle, and the load form and the load size are substituted as boundary conditions into the stiffness matrix of a corresponding model by the processing device to solve and obtain a solution $\bar{f}$ of a parameter to be solved in a frequency domain, wherein the load form and the load size determined according to the specific vehicle are $$f(x_1, y_1, t) = \begin{cases} \dfrac{Pe^{i\Omega_0 t}}{40l_1 l_2} : \begin{cases} (d_a - l_1) \le x_1 - Vt \le (d_a + l_1), (d_w + d_t - l_2) \le |y_1| \le (d_w + d_t + l_2) \\ (d_a - l_1) \le x_1 - Vt \le (d_a + l_1), (d_w - d_t - l_2) \le |y_1| \le (d_w + d_t + l_2) \\ (-d_a - l_1) \le x_1 - Vt \le (-d_a + l_1), (d_w + d_t - l_2) \le |y_1| \le (d_w + d_t + l_2) \\ (-d_a - l_1) \le x_1 - Vt \le (-d_a + l_1), (d_w - d_t - l_2) \le |y_1| \le (d_w - d_t + l_2) \\ (d_a - l_1) \le x_1 - Vt \le (d_a + l_1), (d_w - l_2) \le |y_1| \le (d_w + l_2) \end{cases} \\ 0; \text{others} \end{cases}$$

wherein P represents a total axle load of the specific vehicle, and in the moving coordinate system $x=x_1-Vt$, $y=y_1$, $z=z_1$.

In the transform domain, the load form and the load size determined according to the specific vehicle are $$\bar{f}(\beta, \gamma) = \dfrac{P(e^{-\gamma d_w} + e^{i\gamma d_w})}{10 l_1 l_2 \beta \gamma} \quad (12)$$

$$[\sin(\beta l_1)\sin(\gamma l_2)e^{-i\beta d_c} + \sin(\beta l_1)\sin(\gamma l_2)(e^{-i\beta d_a} + e^{-i\beta d_a})(e^{-i\gamma d_t} + e^{i\gamma d_t})]$$

the boundary condition of the rigid pavement expressway model is:

$$\begin{cases} \tau^1_{zz,b}(x, y, t) = -\varphi(x, y, t) \\ \tau^1_{xz,b}(x, y, t) = \tau^1_{yz,b}(x, y, t) = p^2_w(x, y, t) = p^2_a(x, y, t) = 0 \\ u^1_{zz,b}(x, y, t) = W(x, y, t) \end{cases} \quad (13)$$

the boundary condition of the rigid pavement expressway model with the time term $e^{i\Omega_0 t}$ removed is expressed as:

$$\begin{cases} \bar{\tau}^1_{zz,b}(\beta, \gamma) = -\bar{\varphi}(\beta, \gamma) \\ \bar{\tau}^1_{xz,b}(\beta, \gamma) = \bar{\tau}^1_{yz,b}(\beta, \gamma) = \bar{p}^2_w(\beta, \gamma) = \bar{p}^2_a(\beta, \gamma) = 0 \\ \bar{u}^1_{zz,b}(\beta, \gamma) = W(\beta, \gamma) \end{cases} \quad (14)$$

wherein $$\bar{\varphi}(\beta, \gamma) = \dfrac{\bar{f}(\beta, \gamma)}{1 + B_{33} D_P (\beta^2 + \gamma^2)^2 - B_{33} \omega^2 m_b},$$

and $B_{33}$ is an element in a third row and a third column of $[K^r]^{-1}$ and corresponds to a vertical displacement of the base layer, the boundary condition of the flexible pavement expressway model is:

$$\begin{cases} \tau^0_{zz,P}(x, y, t) = f(x, y, t) \\ \tau^0_{xz}(x, y, t) = \tau^0_{yz}(x, y, t) = p^2_w(x, y, t) = p^2_a(x, y, t) = 0 \end{cases} \quad (15)$$

the boundary condition of the flexible pavement expressway model with the time term $e^{i\Omega_0 t}$ removed is expressed as:

$$\begin{cases} \bar{\tau}^0_{zz,P}(\beta, \gamma) = \bar{f}(\beta, \gamma) \\ \bar{\tau}^0_{xz}(\beta, \gamma) = \bar{\tau}^0_{yz}(\beta, \gamma) = \bar{p}^2_w(\beta, \gamma) = \bar{p}^2_a(\beta, \gamma) = 0 \end{cases} \quad (16)$$

wherein for the rigid pavement expressway model, the corresponding boundary condition is substituted into the total stiffness matrix of the rigid pavement expressway model, and for the flexible pavement expressway model, the corresponding boundary condition is substituted into the total stiffness matrix of the flexible pavement expressway model, in such a way to obtain the displacement of each surface, the displacement $\{\bar{u}_x^2 \ \bar{u}_y^2 \ i\bar{u}_z^2 \ \overline{W}^2 \ \overline{V}^2\}$ of the top surface of the subgrade is substituted into the stress-strain relationship of the unsaturated subgrade in the transform domain to obtain a stress $\{\bar{\tau}_{xz,s} \ \bar{\tau}_{yz,s} \ \bar{\tau}_{zz,s} \ \bar{p}_w \ \bar{p}_\alpha\}$ and a displacement $\{\bar{u}_x^2 \ \bar{u}_y^2 \ \bar{u}_z^2 \ \overline{W}^2 \ \overline{V}^2\}$ at any position inside the subgrade in the frequency domain, and a vibration velocity and an acceleration of the subgrade can be calculated according to the displacement, the vibration velocity and the acceleration are $\bar{v}_{ij}=i\omega\bar{u}_{ij}$ and $\bar{a}_{ij}=-\omega\bar{u}_{ij}$.

In this process, the load of the vehicle that may be involved in the actual expressway environment, such as a heavy loaded 10-wheeled truck, is introduced into the stiffness matrix constructed in the Step S104 for solving. During the solving process, the constraint of boundary conditions of the configuration may be involved. The solution range is constrained so that the solution results may be more accurate.

It should be understood that the solution results at this stage are still parameters in the frequency domain, and further data processing is still required to facilitate practical use.

In Step S105: an inverse fast Fourier transform is used by the processing device to convert the solution $\bar{f}$ of the parameter to be solved in the frequency domain into a solution f in the time domain, wherein the solution f in the time domain is a stress $\{\tau_{xz,s} \ \tau_{yz,s} \ \tau_{zz,s} \ p_w \ p_\alpha\}$, a displacement $\{u^2_x \ u^2_y \ u^2_z \ W^2 \ V^2\}$, a velocity $v_{ij}$ and an acceleration $a_{ij}$.

Here, corresponding to the above-mentioned double Fourier transform, parameters in the frequency domain solved in Step S104 are converted into parameters in the time domain by the inverse fast Fourier transform, which are the final required parameters and also the parameters that can be used conveniently in practical applications.

For instance, 2048×2048 points can be selected between $-16<\beta<16$ m−1 and $-16<\gamma<16$ m−1, and values of parameters to be solved in the frequency domain at each integration point can be calculated.

It can be seen from the above contents that the present disclosure analyzes the performance of the subgrade of the expressway from the construction of the structural model of the expressway to the derivation of the dynamic governing equations, then removes time terms in the dynamic governing equations and constructs corresponding dynamic stiffness matrices through double Fourier transform, and then introduces boundary conditions to continue to solve the dynamic stiffness matrices, and finally converts the parameter solution results in the frequency domain into the parameter solution results in the time domain through the inverse fast Fourier transform, in such a way to accurately calculate the stress, displacement, velocity and acceleration at any position inside the subgrade while analyzing the performance of the subgrade of the target expressway section, in full consideration of the moving speed and vibration characteristics of the vehicle load, the layered characteristics of the expressway and the unsaturated characteristics of the subgrade soil, thereby providing a strong data support for the development of the project.

Furthermore, each step of the above embodiment as shown in FIG. 1 and possible implementation modes thereof in practical applications will be explained in detail in combination with practical applications.

It can be understood that as the trigger of the analysis and processing of the performance of the subgrade of the expressway section, it can also be realized in the form of a task in practical applications.

Namely, the method for determining the performance of the subgrade of the expressway section provided by the present disclosure further includes Step S106, which is prior to Step S101:

the processing device acquiring a task of determining the performance of the subgrade of the target expressway section.

Wherein the acquisition of the task of determining the performance of the subgrade of the target expressway section can be actively acquired or passively received, which may be adjusted as actually required.

As an actively acquired implementation mode, Step S106 specifically includes:

the processing device monitoring whether project data on a system are updated; and in response to monitoring that the project data are updated, the processing device acquiring the task of determining the performance of the subgrade of the target expressway section according to the updated target project data.

It can be understood that the processing device itself can be a device included in the office system of the project for the purpose of monitoring and updating within the system.

Alternatively, the processing device may also externally establish a communication connection with the office system of the project so as to interact with the system for the purpose of monitoring and updating.

As a passively received implementation mode, Step S106 specifically comprises:

the processing device receiving the task of determining the performance of the subgrade of the target expressway section as inputted by a user.

Wherein the task can be specifically the one inputted into the device locally by a user of human-computer interaction, which is applicable to on-site office scenario.

Alternatively, the task can also be the one inputted by a user of human-computer interaction and received by the device locally from another device, which is applicable to remote task assigning scenario.

Furthermore, after the parameter solution results in the time domain are obtained through conversion in Step S105, they can also be outputted, namely, the method for determining the performance of the subgrade of the expressway section can further include Step S107:

the processing device outputting the solution f in the time domain.

It can be understood that the output processing herein is executed under a predetermined output strategy. The output carrier involved can be hardware such as a display screen, or even a loudspeaker, or an indicator light, and the output manner can be specifically a text message, instant message, document, image, voice, vibration, lighting effect, etc., which can be configured according to the output effect demands in practical applications.

The present disclosure also provides a practical implementation mode in combination with the project scenario in practical applications. In the output process, Step S107 can specifically include:

the processing device outputting a performance determination report of the subgrade of the target expressway section, wherein the performance determination report includes the solution f in the time domain.

It can be understood that the solution f in the time domain (the parameter solution result in the time domain) is directly carried in the performance determination report in the original application scenario, which is greatly convenient for application. The report also contains the contents in other different aspects.

Of course, the performance determination report can also be the one arranged for the report working mode that commonly exists in the original application scenario, and can be conveniently embedded into the specific application scenario in a terminal data output processing step.

In addition, for the parameter solution result in the time domain, an early warning mechanism may also be introduced in practical applications. Therefore, the method for determining the performance of the subgrade of the expressway section can also include Step S108, which is subsequent to Step S105:

the processing device determining whether a value of the solution f in the time domain reaches a predetermined alarm value; and in response to determining the value of the solution f in the time domain reaches the predetermined alarm value, the processing device outputting an alarm prompt.

It can be understood that the predetermined alarm value can be a numerical threshold value, or a time element can also be introduced as the alarm value for dynamic monitoring, such as the change rate in unit time or the change range in unit time, so that different specific warning conditions can be set according to different warning demands.

Then, alarm prompts can also be outputted in different output forms according to actual needs. The output carrier involved can be hardware such as a display screen, or even a loudspeaker, or an indicator light, and the output manner can be specifically a text message, instant message, document, image, voice, vibration, lighting effect, etc., which can be configured according to the output effect demands in practical applications.

The above is the introduction of the method for determining the performance of the subgrade of the expressway section provided by the present disclosure. In order to better implement the method for determining the performance of the subgrade of the expressway section provided by the present disclosure, the present disclosure also provides an apparatus for determining a performance of an unsaturated subgrade of a multi-layered expressway section from the perspective of functional modules.

Figure 3:
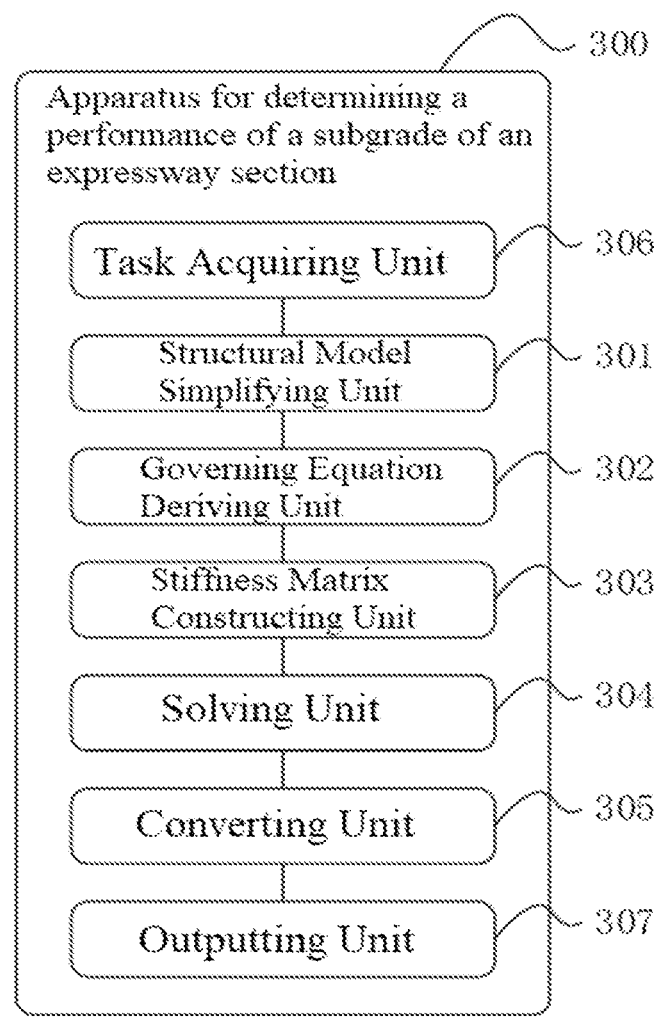
FIG. 3 shows a structural schematic view of an apparatus for determining a performance of an unsaturated subgrade of a multi-layered expressway section of the present disclosure.

With reference to FIG. 3, FIG. 3 shows a structural schematic view of an apparatus for determining a performance of an unsaturated subgrade of a multi-layered expressway section of the present disclosure. In the present disclosure, the apparatus 300 for determining a performance of an unsaturated subgrade of a multi-layered expressway section can specifically include a structural model simplifying unit 301, a governing equation deriving unit 302, a stiffness matrix constructing unit 303, a solving unit 304 and a converting unit 305.

The structural model simplifying unit 301 is configured to use an Odemark equivalent hypothesis of modulus-thickness to simplify a road structure of a target expressway section into a three-layered model, wherein the three-layered model is $$H_e = \left(\frac{E}{E_1}\right)^{1/3} H,$$

wherein $H_e$ is an equivalent thickness, E is a modulus of a layer to be transformed, H is a thickness of the layer to be transformed, and $E_1$ is a modulus of a target layer.

The governing equation deriving unit 302 is configured to, based on the three-layered model, set a base layer of the target expressway section as an elastic medium and set the subgrade of the target expressway section as an unsaturated porous medium to derive and obtain a rigid pavement governing equation, a flexible pavement and base layer governing equation and an unsaturated subgrade governing equation, wherein the rigid pavement governing equation is:

$$D_p\left[\frac{\partial^2 W(x,y,t)}{\partial x^4} + 2\frac{\partial^4 W(x,y,t)}{\partial x^2 \partial y^2} + \frac{\partial^4 W(x,y,t)}{\partial y^4}\right] +$$

$$\rho_p h_p \ddot{W}(x,y,t) + \varphi(x,y,t) = f(x,y,t),$$

wherein $D_p = E_p h_p^3/[12(1-\mu_p^2)]$ is a bending rigidity of a pavement slab, $W(x, y, t)$ is a vertical displacement of the pavement slab, $E_p$, $\rho_p$ and $h_p$ are respectively a modulus, a density and a thickness of the pavement slab, $f(x, y, t)$ is a traffic load on the pavement slab, and $\varphi(x, y, t)$ is a reaction force exerted by the base layer on the pavement slab, the flexible pavement and base layer governing equation is $$\begin{cases} G_b u_{i,jj}^b + (\lambda_b + G_b)u_{j,ji}^b = \rho_b \ddot{u}_i^b \\ \tau_{ij}^b = \lambda_b \theta_b \delta_{ij} = 2G_b \varepsilon_{ij}^b \end{cases},$$

wherein $u^b$ is a displacement of an elastic medium layer, $G_b$ and $\lambda_b$ are Lame constants of the elastic medium layer, $\rho_b$ is a density of the elastic medium layer, $\tau^b$ is a stress of the elastic medium layer, $\tau^b$ and $\varepsilon^b$ respectively represent the stress of the elastic medium layer and a strain of the elastic medium layer, and $\delta_{ij}$ is a Kronecker symbol, the unsaturated subgrade governing equation is $$\begin{cases} -p_{w,i} = \rho_w \ddot{u}_i + \frac{\rho_w}{nS_r}\ddot{W}_i + \frac{\rho_w g}{k_w}\dot{W}_i \\ -p_{a,i} = \rho_a \ddot{u}_i + \frac{\rho_a}{n(1-S)}\ddot{V}_i + \frac{\rho_a g}{k_a}\dot{V}_i \\ A_{11}\dot{p}_w + A_{12}\dot{p}_a + A_{13}\nabla \cdot \dot{u}_i + A_{14}\nabla \cdot \dot{V}_i = 0 \\ A_{21}\dot{p}_w + A_{22}\dot{p}_a + A_{23}\nabla \cdot \dot{u}_i + A_{24}\nabla \cdot \dot{W}_i = 0 \\ \mu\nabla^2 u_i + (\lambda+G)\nabla e - a\chi\nabla p_w - a(1-\chi)\nabla p_a = \rho\ddot{u}_i + \rho_w \ddot{W}_i + \rho_a \ddot{V}_i \end{cases}$$

wherein $$A_{11} = nA_s + (1-S_r)\frac{a\chi - nS_r}{K_s},$$

$$A_{12} = (1-S_r)\left[\frac{a(1-\chi)-n(1-S_r)}{K_s} + \frac{n}{K_a}\right] - nA_s,$$

$$A_{13} = (1-S_r)\left(1-\frac{K_b}{K_s}\right), A_{14} = 1,$$

$$A_{21} = \frac{(a\chi - nS_r)S_r}{K_s} - nA_s + \frac{nS_r}{K_w},$$

$$A_{22} = \frac{[a(1-\chi)-n(1-S_r)]S_r}{K_s} + nA_s, A_{23} = \left(1-\frac{K_b}{K_s}\right)S_r, A_{24} = 1,$$

$$A_s = -\alpha md(1-S_{w0})(S_e)^{\frac{m+1}{m}}\left[(S_e)^{-\frac{1}{m}} - 1\right]^{\frac{d-1}{d}},$$

$a = 1 - K_b/K_s$, $K_b$ and $K_s$ are bulk compressibility moduli of soil skeletons and soil particles respectively, $p_w$ and $p_a$ are pressures of pore water and gas respectively, $\rho_w$ and $\rho_a$ are densities of pore water and gas respectively, $W_i$ and $V_i$ are displacement components of pore water and pore gas relative to soil particles in an i direction, g represents a gravitational acceleration, $k_w$ and $k_a$ represent permeability coefficients of pore water and pore gas respectively, $\chi$ is an effective stress parameter, $\alpha$, m and d are fitting parameters of a soil-water characteristic curve model, $S_e$ is an effective saturation, $S_{w0}$ is an irreducible saturation, n is a soil porosity, and $S_r$ is a saturation.

The stiffness matrix constructing unit 303 is configured to, based on an action form of a vehicle load, respectively set time terms of variables in the rigid pavement governing equation, the flexible pavement and base layer governing equation and the unsaturated subgrade governing equation as a simple harmonic form $e^{i\Omega_0 t}$ and separate the simple harmonic form $e^{i\Omega_0 t}$ of the time terms from the rigid pavement governing equation, the flexible pavement and base layer governing equation, and the unsaturated subgrade governing equation, and then use a double Fourier transform to respectively reduce partial derivatives in a three-dimensional space domain of the rigid pavement governing equation, the flexible pavement and base layer governing equation and the unsaturated subgrade governing equation as ordinary differential equations, to obtain element stiffness matrices of different layer positions after solving and then establish a total dynamic stiffness matrix, wherein the double Fourier transform is $$\overline{f}(\beta,\gamma,z,t) = \int_{-\infty}^{\infty}\int_{-\infty}^{\infty} f(x,y,z,t)e^{-i(\beta x+\gamma y)}dxdy,$$

-continued
$$f(x, y, z, t) = \frac{1}{4\pi^2}\int_{-\infty}^{\infty}\int_{-\infty}^{\infty}\overline{f}(\beta, \gamma, z, t)e^{i(\beta x+\gamma y)}d\beta d\gamma,$$

wherein $\beta$ and $\gamma$ are wave numbers in x and y directions respectively, and f and $\overline{f}$ are variables in the space domain and a corresponding transform domain respectively, the rigid pavement governing equation in the transform domain is:

$$\overline{W}(\beta,\gamma)[D_p(\beta^2+\gamma^2)^2-\Omega^2\rho_p h_p]+\overline{\varphi}(\beta,\gamma)=\overline{f}(\beta,\gamma),$$

a stress-strain relationship of the flexible pavement in the transform domain is:

$$\{\overline{\Sigma}_P\} = [S^P][D^P]^{-1}\{\overline{U}_P\} = [K^P]\{\overline{U}_P\},$$

$$[D^P] = \begin{bmatrix} \frac{-i\beta e^{-\alpha_1 h}}{k_1^2} & \frac{-i\beta}{k_1^2} & e^{-\alpha_2 h} & 1 & 0 & 0 \\ \frac{-i\gamma e^{-\alpha_1 h}}{k_1^2} & \frac{-i\gamma}{k_1^2} & 0 & 0 & e^{-\alpha_2 h} & 1 \\ \frac{-i\alpha_1 e^{-\alpha_1 h}}{k_1^2} & \frac{i\alpha_1}{k_1^2} & \frac{\beta}{\alpha_2}e^{-\alpha_2 h} & \frac{-\beta}{\alpha_2} & \frac{\gamma}{\alpha_2}e^{-\alpha_2 h} & \frac{-\gamma}{\alpha_2} \\ \frac{-i\beta}{k_1^2} & \frac{-i\beta e^{-\alpha_1 h}}{k_1^2} & 1 & e^{-\alpha_2 h} & 0 & 0 \\ \frac{-i\gamma}{k_1^2} & \frac{-i\gamma e^{-\alpha_1 h}}{k_1^2} & 0 & 0 & 1 & e^{-\alpha_2 h} \\ \frac{-i\alpha_1}{k_1^2} & \frac{i\alpha_1 e^{-\alpha_1 h}}{k_1^2} & \frac{\beta}{\alpha_2} & \frac{-\beta}{\alpha_2}e^{-\alpha_2 h} & \frac{\gamma}{\alpha_2} & \frac{-\gamma}{\alpha_2}e^{-\alpha_2 h} \end{bmatrix},$$

$$[S^P] = G_p \begin{bmatrix} \frac{2i\beta\alpha_1}{k_1^2}e^{-\alpha_1 h} & -\frac{2i\beta\alpha_1}{k_1^2} & -\frac{(\alpha_2^2+\beta^2)}{\alpha_2}e^{-\alpha_2 h} & \frac{(\alpha_2^2+\beta^2)}{\alpha_2} & -\frac{\beta\gamma}{\alpha_2}e^{-\alpha_2 h} & \frac{\beta\gamma}{\alpha_2} \\ \frac{2i\gamma\alpha_1}{k_1^2}e^{-\alpha_1 h} & -\frac{2i\gamma\alpha_1}{k_1^2} & -\frac{\beta\gamma}{\alpha_2}e^{-\alpha_2 h} & \frac{\beta\gamma}{\alpha_2} & -\frac{(\alpha_2^2+\gamma^2)}{\alpha_2}e^{-\alpha_2 h} & \frac{(\alpha_2^2+\gamma^2)}{\alpha_2} \\ \frac{i(2\alpha_2^2+k_2^2)}{k_1^2}e^{-\alpha_1 h} & \frac{i(2\alpha_2^2+k_2^2)}{k_1^2} & -2\beta e^{-\alpha_2 h} & -2\beta & -2\gamma e^{-\alpha_2 h} & -2\gamma \\ \frac{-2i\beta\alpha_1}{k_1^2} & \frac{2i\beta\alpha_1}{k_1^2}e^{-\alpha_1 h} & \frac{(\alpha_2^2+\beta^2)}{\alpha_2} & -\frac{(\alpha_2^2+\beta^2)}{\alpha_2}e^{-\alpha_2 h} & \frac{\beta\gamma}{\alpha_2} & -\frac{\beta\gamma}{\alpha_2}e^{-\alpha_2 h} \\ \frac{-2i\gamma\alpha_1}{k_1^2} & \frac{2i\gamma\alpha_1}{k_1^2}e^{-\alpha_1 h} & \frac{\beta\gamma}{\alpha_2} & -\frac{\beta\gamma}{\alpha_2}e^{-\alpha_2 h} & \frac{(\alpha_2^2+\gamma^2)}{\alpha_2} & -\frac{(\alpha_2^2+\gamma^2)}{\alpha_2}e^{-\alpha_2 h} \\ \frac{-i(2\alpha_2^2+k_2^2)}{k_1^2} & \frac{-i(2\alpha_2^2+k_2^2)}{k_1^2}e^{-\alpha_1 h} & 2\beta & 2\beta e^{-\alpha_2 h} & 2\gamma & 2\gamma e^{-\alpha_2 h} \end{bmatrix},$$

wherein superscript 0 of elements in the matrix represents a top surface of a flexible pavement layer, and superscript 1 of elements in the matrix represents a bottom surface of the flexible pavement layer, a stress vector $\{\overline{\Sigma}_P\}=\{-\overline{\tau}_{xz,p}{}^0\ -\overline{\tau}_{yz,p}{}^0\ -i\overline{\tau}_{zz,p}{}^0\ \overline{\tau}_{xz,p}{}^1\ -\overline{\tau}_{yz,p}{}^1\ -i\overline{\tau}_{zz,p}{}^1\}^T$, $[D^P]$ is a displacement matrix of the flexible pavement, $[S^P]$ is a stress matrix of the flexible pavement, a displacement vector $\{\overline{U}_P\}=\{\overline{u}_{x,p}{}^0\ \overline{u}_{y,p}{}^0\ i\overline{u}_{z,p}{}^0\ \overline{u}_{x,p}{}^1\ \overline{u}_{y,p}{}^1\ i\overline{u}_{z,p}{}^1\}^T$, $[K^P]=[S^P][D^P]^{-1}$ is a dynamic stiffness matrix of the flexible pavement layer, $\alpha_1{}^2=\beta^2+\gamma^2-k_1{}^2$, $\alpha_2{}^2=\beta^2+\gamma^2-k_2{}^2$, $k_1{}^2=\omega^2/c_1{}^2$, $k_2{}^2=\omega^2/c_2{}^2$, c is a traffic load velocity, $c_1$ and $c_2$ are a compression wave velocity and a shear wave velocity of the elastic medium respectively, $\omega=\Omega_0-\beta c$, h represents a thickness of the flexible pavement layer, and i is an imaginary number, a stress-strain relationship of the elastic base layer in the transform domain is:

$$\{\overline{\Sigma}_b\}=[S^b][D^b]^{-1}\{\overline{U}_b\}=[K^b]\{\overline{U}_b\},$$

a stress-strain relationship of the unsaturated subgrade in the transform domain is:

$$\{\textstyle\sum_s\} = [S^s][D^s]^{-1}\{\overline{U}_s\} = [K^s]\{\overline{U}_s\},$$

$$[D_s] = \begin{bmatrix} -\frac{\gamma}{\beta}e^{-\lambda_0 z} & \frac{i\lambda_0}{\beta}e^{-\lambda_0 z} & S_1 i\beta e^{-\lambda_1 z} & S_2 i\beta e^{-\lambda_2 z} & S_3 i\beta e^{-\lambda_3 z} \\ e^{-\lambda_0 z} & 0 & S_1 i\gamma e^{-\lambda_1 z} & S_2 i\gamma e^{-\lambda_2 z} & S_3 i\gamma e^{-\lambda_3 z} \\ 0 & -i e^{-\lambda_0 z} & -i S_1 \lambda_1 e^{-\lambda_1 z} & -i S_2 \lambda_2 e^{-\lambda_2 z} & -i S_3 \lambda_3 e^{-\lambda_3 z} \\ 0 & -\frac{\omega^2}{b^w}e^{-\lambda_0 z} & -\frac{B_{w1}}{b^w \rho_w}e^{-\lambda_1 z} & -\frac{B_{w2}}{b^w \rho_w}e^{-\lambda_2 z} & -\frac{B_{w3}}{b^w \rho_w}e^{-\lambda_3 z} \\ 0 & -\frac{\omega^2}{b^a}e^{-\lambda_0 z} & -\frac{B_{a1}}{b^a \rho_a}e^{-\lambda_1 z} & -\frac{B_{a2}}{b^a \rho_a}e^{-\lambda_2 z} & -\frac{B_{a3}}{b^a \rho_a}e^{-\lambda_3 z} \end{bmatrix},$$

$$[S^s] = \begin{bmatrix} -\frac{\gamma \lambda_0 G}{\beta}e^{-\lambda_0 z} & iG\left(\frac{\lambda_0^2}{\beta}+\beta\right)e^{-\lambda_0 z} & 2GS_1 i\beta \lambda_1 e^{-\lambda_1 z} & 2GS_2 i\beta \lambda_2 e^{-\lambda_2 z} & 2GS_3 i\beta \lambda_3 e^{-\lambda_3 z} \\ G\lambda_0 e^{-\lambda_0 z} & iG\gamma e^{-\lambda_0 z} & 2GS_1 i\gamma \lambda_1 e^{-\lambda_1 z} & 2GS_2 i\gamma \lambda_2 e^{-\lambda_2 z} & 2GS_3 i\gamma \lambda_3 e^{-\lambda_3 z} \\ 0 & -i2G\lambda_0 e^{-\lambda_0 z} & -iB_1 e^{-\lambda_1 z} & -iB_2 e^{-\lambda_2 z} & -iB_3 e^{-\lambda_3 z} \\ 0 & 0 & -f_{w1} e^{-\lambda_1 z} & -f_{w2} e^{-\lambda_2 z} & -f_{w3} e^{-\lambda_3 z} \\ 0 & 0 & -f_{a1} e^{-\lambda_1 z} & -f_{a2} e^{-\lambda_2 z} & -f_{a3} e^{-\lambda_3 z} \end{bmatrix},$$

wherein $$\{\textstyle\sum_s\} = \{-\overline{\tau}_{xz,s} \quad -\overline{\tau}_{yz,s} \quad -i\overline{\tau}_{zz,s} \quad -\overline{p}_w \quad -\overline{p}_a\}^T,$$

$$\{\overline{U}_s\} = \{\overline{u}_{x,s} \quad \overline{u}_{y,s} \quad i\overline{u}_{z,s} \quad \overline{W} \quad \overline{V}\}^T,$$

$$B_{wn} = \omega^2 \rho_w S_n \lambda_n - f_{wn} \lambda_n,$$

$$B_{an} = \omega^2 \rho_a S_n \lambda_n - f_{an} \lambda_n,$$

$$B_n = 2\mu S_n \lambda_n^2 + \lambda - aX f_{wn} - a(1-X)f_{an},$$

$$S_n = -\frac{\lambda + \mu + b_1 f_{wn} + b_2 f_{an}}{b_3 + \mu d_n},$$

$$f_{an} = \frac{b_{13}b_{31} - b_{11}b_{33} + b_{11}d_n}{b_{11}b_{32} - b_{31}b_{12} + b_{31}d_n},$$

$$f_{wn} = \frac{b_{32}b_{23} - b_{22}b_{33} + b_{22}d_n}{b_{22}b_{31} - b_{32}b_{21} + b_{32}d_n},$$

$$\lambda_n = \sqrt{\beta^2 + \gamma^2 + d_n}, \; d_n$$

is roots of an equation $$d_n^3 + b_4 d_n^2 + b_5 d_n + b_6 = 0,$$

$$b_4 = -b_{12} - b_{33} - b_{21},$$

$$b_5 = b_{12}b_{33} - b_{13}b_{32} + b_{21}b_{12} + b_{21}b_{33} - b_{22}b_{11} - b_{23}b_{31},$$

$$b_6 = -b_{21}b_{12}b_{33} - b_{13}b_{31}b_{22} -$$

$$b_{23}b_{11}b_{32} + b_{21}b_{13}b_{32} + b_{22}b_{11}b_{33} + b_{23}b_{31}b_{12},$$

$$n=1,2,3, \; b_1 = -aX - \frac{\omega^2}{b^w}, \; b_2 = -a(1-X) - \frac{\omega^2}{b^a},$$

-continued $$b_3 = \rho\omega^2 + \frac{\omega^4 \rho_w}{b^w} + \frac{\omega^4 \rho_a}{b_a}, \; b_{11} = b^a \rho_a A_{11}, \; b_{12} = b^a \rho_a A_{12},$$

$$b_{13} = \omega^2 \rho_a + b^a \rho_a A_{13}, \; b_{21} = b^w \rho_w A_{21}, \; b_{22} = b^w \rho_w A_{22},$$

$$b_{23} = \omega^2 \rho_a + b^w \rho_w A_{23}, \; b_{31} = -\frac{b_1 b_{21} + b_2 b_{11}}{\lambda + 2\mu}, \; b_{32} = -\frac{b_1 b_{22} + b_2 b_{12}}{\lambda + 2\mu},$$

$$b_{33} = -\frac{b_1 b_{23} + b_2 b_{13} + b_3}{\lambda + 2\mu}, \; b^w = -\frac{\omega^2}{nS_r} + \frac{i\omega g}{k_w}, \; b^a = -\frac{\omega^2}{n(1-S_r)} + \frac{i\omega g}{k_a},$$

a total stiffness matrix of a flexible pavement expressway model is:

$$\{\textstyle\sum_f\} = [K^f]\{\overline{U}_f\},$$

wherein $\{\textstyle\sum_f\} = \{-\overline{\tau}_{xz,p}{}^0 \; -\overline{\tau}_{yz,p}{}^0 \; -i\overline{\tau}_{zz,p}{}^0 \; 0\;0\;0\;0\;0\;0\;0\;0\}^T$, $\{\overline{U}_f\} = \{\overline{u}_x{}^0 \; \overline{u}_y{}^0 \; i\overline{u}_z{}^0 \; \overline{u}_x{}^1 \; \overline{u}_y{}^1 \; i\overline{u}_z{}^1 \; \overline{u}_x{}^2 \; \overline{u}_y{}^2 \; i\overline{u}_z{}^2 \; \overline{W}^2 \; \overline{V}^2\}^T$, superscripts 0, 1, 2 correspond to different layer positions shown from top to bottom in the three-layered model, and $[K^f]$ is a matrix of 11×11, a total stiffness matrix of a rigid pavement expressway model is:

$$\{\textstyle\sum_r\} = [K^r]\{\overline{U}_r\},$$

wherein $\{\textstyle\sum_r\} = \{-\overline{\tau}_{xz,b}{}^1 \; -\overline{\tau}_{yz,b}{}^1 \; -i\overline{\tau}_{zz,b}{}^1 \; 0\;0\;0\;0\;0\}^T$, $\{\overline{U}_r\} = \{\overline{u}_x{}^1 \; \overline{u}_y{}^1 \; i\overline{u}_z{}^1 \; \overline{u}_x{}^2 \; \overline{u}_y{}^2 \; i\overline{u}_z{}^2 \; \overline{W}^2 \; \overline{V}^2\}^T$, and $[K^r]$ is a matrix of 8×8.

The solving unit 304 is configured to determine a load form and a load size according to a specific vehicle, substituting the load form and the load size as boundary conditions into the stiffness matrix of a corresponding model to solve and obtain a solution of a parameter to be solved in a frequency domain, wherein the load form and the load size determined according to the specific vehicle are $$f(x_1, y_1, t) =$$

$$\begin{cases} \dfrac{Pe^{i\Omega_0 t}}{4 0 l_1 l_2} : \begin{cases} (d_a - l_1) \le x_1 - Vt \le (d_a + l_1), (d_w + d_t - l_2) \le |y_1| \le (d_w + d_t + l_2) \\ (d_a - l_1) \le x_1 - Vt \le (d_a + l_1), (d_w - d_t - l_2) \le |y_1| \le (d_w - d_t + l_2) \\ (-d_a - l_1) \le x_1 - Vt \le (-d_a + l_1), (d_w + d_t - l_2) \le |y_1| \le (d_w + d_t + l_2) \\ (-d_a - l_1) \le x_1 - Vt \le (-d_a + l_1), (d_w - d_t - l_2) \le |y_1| \le (d_w - d_t + l_2) \\ (d_a - l_1) \le x_1 - Vt \le (d_a + l_1), (d_w - l_2) \le |y_1| \le (d_w + l_2) \end{cases} \\ 0; \text{ others} \end{cases},$$

wherein P represents a total axle load of the specific vehicle, and in a moving coordinate system, $x = x_1 - Vt$, $y = y_1$, $z = z_1$;

wherein in the transform domain, the load form and the load size determined according to the specific vehicle are $$\bar{f}(\beta, \gamma) = \frac{P(e^{-i\gamma d_w} + e^{i\gamma d_w})}{10 l_1 l_2 \beta \gamma}$$
$$[\sin(\beta l_1)\sin(\gamma l_2)e^{-i\beta d_c} + \sin(\beta l_1)\sin(\gamma l_2)(e^{-i\beta d_a} + e^{-i\beta d_a})(e^{-i\gamma d_t} + e^{i\gamma d_t})],$$

the boundary condition of the rigid pavement expressway model is:

$$\begin{cases} \tau^1_{zz,b}(x, y, t) = -\varphi(x, y, t) \\ \tau^1_{xz,b}(x, y, t) = \tau^1_{yz,b}(x, y, t) = p^2_w(x, y, t) = p^2_a(x, y, t) = 0, \\ u^1_{zz,b}(x, y, t) = W(x, y, t) \end{cases}$$

the boundary condition of the rigid pavement expressway model with the time term $e^{i\Omega_0 t}$ removed is expressed as:

$$\begin{cases} \bar{\tau}^1_{zz,b}(\beta, \gamma) = -\bar{\varphi}(\beta, \gamma) \\ \bar{\tau}^1_{xz,b}(\beta, \gamma) = \bar{\tau}^1_{yz,b}(\beta, \gamma) = \bar{p}^2_w(\beta, \gamma) = \bar{p}^2_a(\beta, \gamma) = 0, \\ \bar{u}^1_{zz,b}(\beta, \gamma) = \bar{W}(\beta, \gamma) \end{cases}$$

wherein $$\bar{\varphi}(\beta, \gamma) = \frac{\bar{f}(\beta, \gamma)}{1 + B_{33} D_P (\beta^2 + \gamma^2)^2 - B_{33} \omega^2 m_b},$$

and $B_{33}$ is an element in a third row and a third column of $[K']^{-1}$ and corresponds to a vertical displacement of the base layer, the boundary condition of the flexible pavement expressway model is:

$$\begin{cases} \tau^0_{zz,p}(x, y, t) = f(x, y, t) \\ \tau^0_{xz}(x, y, t) = \tau^0_{yz}(x, y, t) = p^2_w(x, y, t) = p^2_a(x, y, t) = 0 \end{cases},$$

the boundary condition of the flexible pavement expressway model with the time term $e^{i\Omega_0 t}$ removed is expressed as:

$$\begin{cases} \bar{\tau}^0_{zz,p}(\beta, \gamma) = \bar{f}(\beta, \gamma) \\ \bar{\tau}^0_{xz}(\beta, \gamma) = \bar{\tau}^0_x(\beta, \gamma) = \bar{p}^2_w(\beta, \gamma) = \bar{p}^2_a(\beta, \gamma) = 0 \end{cases},$$

wherein for the rigid pavement expressway model, the corresponding boundary condition is substituted into the total stiffness matrix of the rigid pavement expressway model, and for the flexible pavement expressway model, the corresponding boundary condition is substituted into the total stiffness matrix of the flexible pavement expressway model, in such a way to obtain the displacement of each surface, the displacement $\{\bar{u}_x^2 \ \bar{u}_y^2 \ i\bar{u}_z^2 \ \bar{W}^2 \ \bar{V}^2\}$ of the top surface of the subgrade is substituted into the stress-strain relationship of the unsaturated subgrade in the transform domain to obtain a stress $\{\bar{\tau}_{xz,s} \ \bar{\tau}_{yz,s} \ \bar{\tau}_{zz,s} \ \bar{p}_w \ \bar{p}_\alpha\}$ and a displacement $\{\bar{u}_x^2 \ \bar{u}_y^2 \ \bar{u}_z^2 \ \bar{W}^2 \ \bar{V}^2\}$ at any position inside the subgrade in the frequency domain, and a vibration velocity of $\bar{v}_{ij} = i\omega\bar{u}_{ij}$ and an acceleration of $\bar{a}_{ij} = -\omega^2 \bar{u}_{ij}$ of the subgrade can be calculated according to the displacement.

The converting unit 305 is configured to use an inverse fast Fourier transform to convert the solution $\bar{f}$ of the parameter to be solved in the frequency domain into a solution f in the time domain, wherein the solution f in the time domain is a stress $\{\tau_{xz,s} \ \tau_{yz,s} \ \tau_{zz,s} \ p_w \ p_\alpha\}$, a displacement $\{u_x^2 \ u_y^2 \ u_z^2 \ W^2 \ V^2\}$, a velocity $v_{ij}$ and an acceleration $a_{ij}$.

In an exemplary implementation mode, the apparatus further includes a task acquiring unit 306, which is configured to:

acquire a task of determining the performance of the subgrade of the target expressway section.

In another exemplary implementation mode, the task acquiring unit 306 is specifically configured to:

monitor whether project data on a system are updated; and if yes, acquire the task of determining the performance of the subgrade of the target expressway section based on the updated target project data.

In another exemplary implementation mode, the task acquiring unit 306 is specifically configured to:

receive the task of determining the performance of the subgrade of the target expressway section as inputted by a user.

In another exemplary implementation mode, the apparatus further includes an outputting unit 307, which is configured to:

output the solution f in the time domain.

In another exemplary implementation mode, the outputting unit 307 is specifically configured to:

output a performance determination report of the subgrade of the target expressway section, wherein the performance determination report includes the solution f in the time domain.

In another exemplary implementation mode, the apparatus further includes a warning unit, which is configured to:

determine whether a value of the solution f in the time domain reaches a predetermined alarm value; and if yes, output an alarm prompt.

Figure 4:
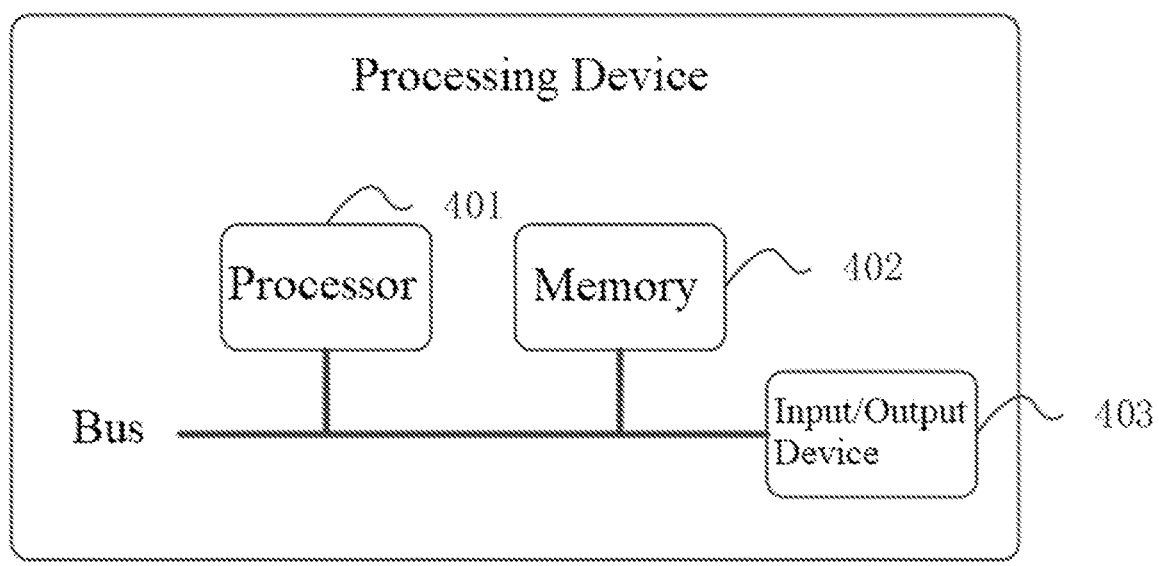
FIG. 4 shows a structural schematic view of a processing device of the present disclosure.

The present disclosure also provides a processing device from the perspective of hardware structure. With reference to FIG. 4, FIG. 4 shows a structural schematic view of the processing device of the present disclosure. Specifically, the processing device of the present disclosure can comprise a processor 401, a memory 402 and an input/output device 403, the processor 401 is used to realize the step of the method for determining a performance of an unsaturated subgrade of a multi-layered expressway section in e.g. the embodiment corresponding to FIG. 1 when the computer program stored in the memory 402 is executed; or the processor 401 is used to realize the function of each unit in e.g. the embodiment corresponding to FIG. 3 when the computer program stored in the memory 402 is executed, and the memory 402 is used to store the computer program required by the processor 401 for executing the method for determining the performance of the subgrade of the expressway section in the embodiment corresponding to FIG. 1.

Exemplarily, the computer program can be divided into one or more modules/units that are stored in the memory 402 and executed by the processor 401 to accomplish the present disclosure. The one or more modules/units can be a series of computer program instruction segments capable of achieving particular functions, and the instruction segments are used to describe the execution process of the computer program in a computer device.

The processing device may include, but is not limited to, the processor 401, the memory 402, and the input/output device 403. Those skilled in the art can understand that only the example of the processing device is schematically shown and does not constitute any limitation to the processing device, and the processing device may include more or fewer components than those schematically shown, or combine some components or different components. For example, the processing device can also include a network access device, a bus and the like, and the processor 401, the memory 402 and the input/output device 403, etc. are connected by the bus.

The processor 401 may be a central processing unit (CPU), or other general-purpose processor, digital signal processor (DSP), application specific integrated circuit (ASIC), field-programmable gate array (FPGA) or other programmable logic device, discrete gate, or transistor logic device, discrete hardware component, etc. The general-purpose processor may be a microprocessor or any conventional processor. The processor is the control center of the processing device, which is connected to each part of the entire apparatus by means of various interfaces and lines.

The memory 402 may be used to store a computer program and/or module, and the processor 401 realizes the various functions of the computer device by operating or executing a program and/or module stored in the memory 402, and calling data stored in the memory 402. The memory 402 can mainly include a storage program area and a storage data area, wherein the storage program area may store an operating system, an application program required for realizing at least one function, and the like; the storage data area may store data created according to the use of the processing device. In addition, the memory can include a high-speed random access memory, or non-volatile memory, such as a hard disk, internal memory, plug-in hard disk, smart media card (SMC), secure digital (SD) card, flash card, at least one disk storage device, flash device, or other volatile solid-state storage devices.

When executing a computer program stored in the memory 402, the processor 401 is configured to:

use an Odemark equivalent hypothesis of modulus-thickness to simplify a road structure of a target expressway section into a three-layered model, wherein the three-layered model is $$H_e = \left(\frac{E}{E_1}\right)^{1/3} H,$$

wherein $H_e$ is an equivalent thickness, E is a modulus of a layer to be transformed, H is a thickness of the layer to be transformed, and $E_1$ is a modulus of a target layer;

based on the three-layered model, set a base layer of the target expressway section as an elastic medium and set the subgrade of the target expressway section as an unsaturated porous medium to derive and obtain a rigid pavement governing equation, a flexible pavement and base layer governing equation, and an unsaturated subgrade governing equation, wherein the rigid pavement governing equation is:

$$D_p\left[\frac{\partial^4 W(x,y,t)}{\partial x^4} + 2\frac{\partial^4 W(x,y,t)}{\partial x^2 \partial y^2} + \frac{\partial^4 W(x,y,t)}{\partial y^4}\right] + \rho_p h_p \ddot{W}(x,y,t) + \varphi(x,y,t) = f(x,y,t),$$

wherein $D_p = E_p h_p^3/[12(1-\mu_p^2)]$ is a bending rigidity of a pavement slab, $W(x, y, t)$ is a vertical displacement of the pavement slab, $E_p$, $\rho_p$ and $h_p$ are respectively a modulus, a density and a thickness of the pavement slab, $f(x, y, t)$ is a traffic load on the pavement slab, and $\varphi(x, y, t)$ is a reaction force exerted by the base layer on the pavement slab, the flexible pavement and base layer governing equation is $$\begin{cases} G_b u_{i,jj}^b + (\lambda_o + G_b)u_{j,ji}^b = \rho_b \ddot{u}_i^b \\ \tau_{ij}^b = \lambda_b \theta_b \delta_{ij} + 2G_b \varepsilon_{ij}^b \end{cases},$$

wherein $u^b$ is a displacement of an elastic medium layer, $G_b$ and $\lambda_b$ are Lame constants of the elastic medium layer, $\rho_b$ is a density of the elastic medium layer, $\tau^b$ is a stress of the elastic medium layer, $\tau^b$ and $\varepsilon^b$ respectively represent the stress of the elastic medium layer and a strain of the elastic medium layer, and $\delta_{ij}$ is a Kronecker symbol, the unsaturated subgrade governing equation is $$\begin{cases} -p_{w,i} = \rho_w \ddot{u}_i + \frac{\rho_w}{nS_r}\ddot{W}_i + \frac{\rho_w g}{k_w}\dot{W}_i \\ -p_{a,i} = \rho_a \ddot{u}_i + \frac{\rho_a}{n(1-S_r)}\ddot{V}_i + \frac{\rho_a g}{k_a}\dot{V}_i \\ A_{11}\dot{p}_w + A_{12}\dot{p}_a + A_{13}\nabla \cdot \dot{u}_i + A_{14}\nabla \cdot \dot{V}_i = 0 \\ A_{21}\dot{p}_w + A_{22}\dot{p}_a + A_{23}\nabla \cdot \dot{u}_i + A_{24}\nabla \cdot \dot{W}_i = 0 \\ \mu\nabla^2 u_i + (\lambda + G)\nabla e - a\chi\nabla p_w - a(1-\chi)\nabla p_a = \rho\ddot{u}_i + \rho_w \ddot{W}_i + \rho_a \ddot{V}_i \end{cases},$$

wherein $$A_{11} = nA_s + (1-S_r)\frac{a\chi - nS_r}{K_s},$$

$$A_{12} = (1-S_r)\left[\frac{a(1-\chi) - n(1-S_r)}{K_s} + \frac{n}{K_a}\right] - nA_s,$$

$$A_{13} = (1-S_r)\left(1 - \frac{K_b}{K_s}\right), A_{14} = 1,$$

$$A_{21} = \frac{(a\chi - nS_r)S_r}{K_s} - nA_s + \frac{nS_r}{K_w},$$

-continued $$A_{22} = \frac{[a(1-\chi) - n(1-S_r)]S_r}{K_s} + nA_s,$$

$$A_{23} = \left(1 - \frac{K_b}{K_s}\right)S_r, A_{24} = 1,$$

$$A_s = -\alpha m d(1 - S_{w0})(S_e)^{\frac{m+1}{m}}\left[(S_e)^{-\frac{1}{m}} - 1\right]^{\frac{d-1}{d}},$$

$$a = 1 - K_b/K_s, K_b \text{ and } K_s$$

are bulk compressibility moduli of soil skeletons and soil particles respectively, $p_w$ and $p_a$ are pressures of pore water and gas respectively, $\rho_w$ and $\rho_a$ are densities of pore water and gas respectively, $W_i$ and $V_i$ are displacement components of pore water and pore gas relative to soil particles in an i direction, g represents a gravitational acceleration, $k_w$ and $k_a$ represent permeability coefficients of pore water and pore gas respectively, $\chi$ is an effective stress parameter, $\alpha$, m and d are fitting parameters of a soil-water characteristic curve model, $S_e$ is an effective saturation, $S_{w0}$ is an irreducible saturation, n is a soil porosity, and $S_r$ is a saturation;

based on an action form of a vehicle load, respectively set time terms of variables in the rigid pavement governing equation, the flexible pavement and base layer governing equation and the unsaturated subgrade governing equation respectively as a simple harmonic form $e^{i\Omega_0 t}$ and separate the simple harmonic form $e^{i\Omega_0 t}$ of the time terms from the rigid pavement governing equation, the flexible pavement and base layer governing equation and the unsaturated subgrade governing equation, and then use a double Fourier transform to respectively reduce partial derivatives in a three-dimensional space domain of the rigid pavement governing equation, the flexible pavement and base layer governing equation and the unsaturated subgrade governing equation as ordinary differential equations, to obtain element stiffness matrices of different layer positions after solving and then establish a total dynamic stiffness matrix, wherein the double Fourier transform is $$\bar{f}(\beta, \gamma, z, t) = \int_{-\infty}^{\infty}\int_{-\infty}^{\infty} f(x, y, z, t)e^{-i(\beta x + \gamma y)}dxdy,$$

$$f(x, y, z, t) = \frac{1}{4\pi^2}\int_{-\infty}^{\infty}\int_{-\infty}^{\infty} \bar{f}(\beta, \gamma, z, t)e^{i(\beta x + \gamma y)}d\beta d\gamma,$$

wherein $\beta$ and $\gamma$ are wave numbers in x and y directions respectively, and f and $\bar{f}$ are variables in the space domain and a corresponding transform domain respectively, the rigid pavement governing equation in the transform domain is:

$$\overline{W}(\beta,\gamma)[D_p(\beta^2+\gamma^2)^2 - \Omega^2\rho_p h_p] + \overline{\varphi}(\beta,\gamma) = \bar{f}(\beta,\gamma),$$

a stress-strain relationship of the flexible pavement in the transform domain is:

$$\{\textstyle\sum_P\}[S^p][D^p]^{-1}\{\bar{U}_P\} = [K^p]\{\bar{U}_P\},$$

$$[D^p] = \begin{bmatrix} \frac{-i\beta e^{-\alpha_1 h}}{k_1^2} & \frac{-i\beta}{k_1^2} & e^{-\alpha_2 h} & 1 & 0 & 0 \\ \frac{-i\gamma e^{-\alpha_1 h}}{k_1^2} & \frac{-i\gamma}{k_1^2} & 0 & 0 & e^{-\alpha_2 h} & 1 \\ \frac{-i\alpha_1 e^{-\alpha_1 h}}{k_1^2} & \frac{i\alpha_1}{k_1^2} & \frac{\beta}{\alpha_2}e^{-\alpha_2 h} & \frac{-\beta}{\alpha_2} & \frac{\gamma}{\alpha_2}e^{-\alpha_2 h} & \frac{-\gamma}{\alpha_2} \\ \frac{-i\beta}{k_1^2} & \frac{-i\beta e^{-\alpha_1 h}}{k_1^2} & 1 & e^{-\alpha_2 h} & 0 & 0 \\ \frac{-i\gamma}{k_1^2} & \frac{-i\gamma e^{-\alpha_1 h}}{k_1^2} & 0 & 0 & 1 & e^{-\alpha_2 h} \\ \frac{-i\alpha_1}{k_1^2} & \frac{i\alpha_1 e^{-\alpha_1 h}}{k_1^2} & \frac{\beta}{\alpha_2} & \frac{-\beta}{\alpha_2}e^{-\alpha_2 h} & \frac{\gamma}{\alpha_2} & \frac{-\gamma}{\alpha_2}e^{-\alpha_2 h} \end{bmatrix},$$

$$[S^p] = G_p\begin{bmatrix} \frac{2i\beta\alpha_1}{k_1^2}e^{-\alpha_1 h} & -\frac{2i\beta\alpha_1}{k_1^2} & -\frac{(\alpha_2^2+\beta^2)}{\alpha_2}e^{-\alpha_2 h} & \frac{(\alpha_2^2+\beta^2)}{\alpha_2} & -\frac{\beta\gamma}{\alpha_2}e^{-\alpha_2 h} & \frac{\beta\gamma}{\alpha_2} \\ \frac{2i\gamma\alpha_1}{k_1^2}e^{-\alpha_1 h} & -\frac{2i\gamma\alpha_1}{k_1^2} & -\frac{\beta\gamma}{\alpha_2}e^{-\alpha_2 h} & \frac{\beta\gamma}{\alpha_2} & -\frac{(\alpha_2^2+\gamma^2)}{\alpha_2}e^{-\alpha_2 h} & \frac{(\alpha_2^2+\gamma^2)}{\alpha_2} \\ \frac{i(2\alpha_2^2+k_2^2)}{k_1^2}e^{-\alpha_1 h} & \frac{i(2\alpha_2^2+k_2^2)}{k_1^2} & -2\beta e^{-\alpha_2 h} & -2\beta & -2\gamma e^{-\alpha_2 h} & -2\gamma \\ \frac{-2i\beta\alpha_1}{k_1^2} & \frac{2i\beta a_1}{k_1^2}e^{-\alpha_1 h} & \frac{(\alpha_2^2+\beta^2)}{\alpha_2} & -\frac{(\alpha_2^2+\beta^2)}{\alpha_2}e^{-\alpha_2 h} & \frac{\beta\gamma}{\alpha_2} & -\frac{\beta\gamma}{\alpha_2}e^{-\alpha_2 h} \\ \frac{-2i\gamma\alpha_1}{k_1^2} & \frac{2i\gamma\alpha_1}{k_1^2}e^{-\alpha_1 h} & \frac{\beta\gamma}{\alpha_2} & -\frac{\beta\gamma}{\alpha_2}e^{-\alpha_2 h} & \frac{(\alpha_2^2+\gamma^2)}{\alpha_2} & -\frac{(\alpha_2^2+\gamma^2)}{\alpha_2}e^{-\alpha_2 h} \\ \frac{-i(2\alpha_2^2+k_2^2)}{k_1^2} & \frac{-i(2\alpha_2^2+k_2^2)}{k_1^2}e^{-\alpha_1 h} & 2\beta & 2\beta e^{-\alpha_2 h} & 2\gamma & 2\gamma e^{-\alpha_2 h} \end{bmatrix},$$

wherein superscript 0 of elements in the matrix represents a top surface of a flexible pavement layer, and superscript 1 of elements in the matrix represents a bottom surface of the flexible pavement layer, a stress vector $\{\bar{\Sigma}_P\} = \{-\bar{\tau}_{xz,p}{}^0 \ -\bar{\tau}_{yz,p}{}^0 \ -i\bar{\tau}_{zz,p}{}^0 \ \bar{\tau}_{xz,p}{}^1 \ \bar{\tau}_{yz,p}{}^1 \ i\bar{\tau}_{zz,p}{}^1\}^T$, $[D^p]$ is a displacement matrix of the flexible pavement, $[S^p]$ is a stress matrix of the flexible pavement, a displacement vector $\{\overline{U}_P\}=\{\overline{u}_{x,p}{}^0\ \overline{u}_{y,p}{}^0\ i\overline{u}_{z,p}{}^0\ \overline{u}_{x,p}{}^1\ \overline{u}_{y,p}{}^1\ i\overline{u}_{z,p}{}^1\}^T$, $[K^p]=[S^p][D^p]^{-1}$ is a dynamic stiffness matrix of the flexible pavement layer, $$\alpha_1^2 = \beta^2 + \gamma^2 - k_1^2,\ \alpha_2^2 = \beta^2 + \gamma^2 - k_2^2,\ k_1^2=\frac{\omega^2}{c_1^2},\ k_2^2=\frac{\omega^2}{c_2^2},$$

c is a traffic load velocity, $c_1$ and $c_2$ are a compression wave velocity and a shear wave velocity of the elastic medium respectively, $\omega=\Omega_0-\beta c$, h represents a thickness of the flexible pavement layer, and i is an imaginary number, a stress-strain relationship of the elastic base layer in the transform domain is:

$$\{\overline{\Sigma}_b\}=[S^b][D^b]^{-1}\{\overline{U}_b\}=[K^b]\{\overline{U}_b\},$$

a stress-strain relationship of the unsaturated subgrade in the transform domain is:

$$\{\overline{\Sigma}_s\} = [S^s][D^s]^{-1}\{\overline{U}_s\} = [K^s]\{\overline{U}_s\},$$

$$[D^s] = \begin{bmatrix} -\frac{\gamma}{\beta}e^{-\lambda_0 z} & \frac{i\lambda_0}{\beta}e^{-\lambda_0 z} & S_1 i\beta e^{-\lambda_1 z} & S_2 i\beta e^{-\lambda_2 z} & S_3 i\beta e^{-\lambda_3 z} \\ e^{-\lambda_0 z} & 0 & S_1 i\gamma e^{-\lambda_1 z} & S_2 i\gamma e^{-\lambda_2 z} & S_3 i\gamma e^{-\lambda_3 z} \\ 0 & -ie^{-\lambda_0 z} & -iS_1\lambda_1 e^{-\lambda_1 z} & -iS_2\lambda_2 e^{-\lambda_2 z} & -iS_3\lambda_3 e^{-\lambda_3 z} \\ 0 & -\frac{\omega^2}{b^w}e^{-\lambda_0 z} & -\frac{B_{w1}}{b^w\rho_w}e^{-\lambda_1 z} & -\frac{B_{w2}}{b^w\rho_w}e^{-\lambda_2 z} & -\frac{B_{w3}}{b^w\rho_w}e^{-\lambda_3 z} \\ 0 & -\frac{\omega^2}{b^a}e^{-\lambda_0 z} & -\frac{B_{a1}}{b^a\rho_a}e^{-\lambda_1 z} & -\frac{B_{a2}}{b^a\rho_a}e^{-\lambda_2 z} & -\frac{B_{a3}}{b^a\rho_a}e^{-\lambda_3 z} \end{bmatrix},$$

$$[S^s] = \begin{bmatrix} -\frac{\gamma\lambda_0 G}{\beta}e^{-\lambda_0 z} & iG\left(\frac{\lambda_0^2}{\beta}+\beta\right)e^{-\lambda_0 z} & 2GS_1 i\beta\lambda_1 e^{-\lambda_1 z} & 2GS_2 i\beta\lambda_2 e^{-\lambda_2 z} & 2GS_3 i\beta\lambda_3 e^{-\lambda_3 z} \\ G\lambda_0 e^{-\lambda_0 z} & iG\gamma e^{-\lambda_0 z} & 2GS_1 i\gamma\lambda_1 e^{-\lambda_1 z} & 2GS_2 i\gamma\lambda_2 e^{-\lambda_2 z} & 2GS_3 i\gamma\lambda_3 e^{-\lambda_3 z} \\ 0 & -i2G\lambda_0 e^{-\lambda_0 z} & -iB_1 e^{-\lambda_1 z} & -iB_2 e^{-\lambda_2 z} & -iB_3 e^{-\lambda_3 z} \\ 0 & 0 & -f_{w1}e^{-\lambda_1 z} & -f_{w2}e^{-\lambda_2 z} & -f_{w3}e^{-\lambda_3 z} \\ 0 & 0 & -f_{a1}e^{-\lambda_1 z} & -f_{a2}e^{-\lambda_2 z} & -f_{a3}e^{-\lambda_3 z} \end{bmatrix}$$

wherein $$\{\overline{\Sigma}_S\} = \{-\overline{\tau}_{xz,s}\ -\overline{\tau}_{yz,s}\ -i\overline{\tau}_{zz,s}\ -\overline{p}_w\ -\overline{p}_a\}^T,$$

$$\{\overline{U}_s\} = \{\overline{u}_{x,s}\ \overline{u}_{y,s}\ i\overline{u}_{z,s}\ \overline{W}\ \overline{V}\}^T,\ B_{wn} = \omega^2 \rho_w S_n \lambda_n - f_{wn}\lambda_n,$$

$$B_{an} = \omega^2 \rho_w S_n \lambda_n - f_{an}\lambda_n,\ B_n = 2\mu S_n \lambda_n^2 + \lambda - a\chi f_{wn} - a(1-\chi)f_{an},$$

$$S_n = -\frac{\lambda+\mu+b_1 f_{wn}+b_2 f_{an}}{b_3+\mu d_n},\ f_{an} = \frac{b_{13}b_{31}-b_{11}b_{33}+b_{11}d_n}{b_{11}b_{32}-b_{31}b_{12}+b_{31}d_n},\ f_{wn} = \frac{b_{32}b_{23}-b_{22}b_{33}+b_{22}d_n}{b_{22}b_{31}-b_{32}b_{21}+b_{32}d_n},$$

$$\lambda_n = \sqrt{\beta^2+\gamma^2+d_n},\ d_n$$

is roots of an equation $$d_n^3 + b_4 d_n^2 + b_5 d_n + b_6 = 0,\ b_4 = -b_{12} - b_{33} - b_{21},$$

$$b_5 = b_{12}b_{33} - b_{13}b_{32} + b_{21}b_{12} + b_{21}b_{33} - b_{22}b_{11} - b_{23}b_{31}$$

$$b_6 = -b_{21}b_{12}b_{33} - b_{13}b_{31}b_{22} - b_{23}b_{11}b_{32} + b_{21}b_{13}b_{32} + b_{22}b_{11}b_{33} + b_{23}b_{31}b_{12},$$

$$n = 1, 2, 3,\ b_1 = -\alpha\chi\frac{\omega^2}{b^w},$$

$$b_2 = -a(1-\chi) - \frac{\omega^2}{b^a},\ b_3 = \rho\omega^2 + \frac{\omega^4 \rho_w}{b^w} + \frac{\omega^4 \rho_a}{b^a},\ b_{11} = b^a\rho_a A_{11},\ b_{12} = b^a\rho_a A_{12},$$

$$b_{13} = \omega^2 \rho_a + b^a\rho_a A_{13},\ b_{21} = b^w\rho_w A_{21},\ b_{22} = b^w\rho_w A_{22},\ b_{23} = \omega^2 \rho_w + b^w\rho_w A_{23},$$

$$b_{31} = \frac{b_1 b_{21} + b_2 b_{11}}{\lambda+2\mu},\ b_{32} = -\frac{b_1 b_{22} + b_2 b_{12}}{\lambda+2\mu},\ b_{33} = -\frac{b_1 b_{23} + b_2 b_{13} + b_3}{\lambda+2\mu},\ b^w = -\frac{\omega^2}{nS_r} + \frac{i\omega g}{k_w},$$

$$b^a = -\frac{\omega^2}{n(1-S_r)} + \frac{i\omega g}{k_a},$$

a total stiffness matrix of a flexible pavement expressway model is:

$\{\Sigma_f\} = [K^f]\{\overline{U}_f\}$, wherein $\{\overline{\Sigma}_f\} = \{-\overline{\tau}_{xz,p}{}^0 \; -\overline{\tau}_{yz,p}{}^0 \; -i\overline{\tau}_{zz,p}{}^0 \; 0\;0\;0\;0\;0\;0\;0\;0\}^T$, $\{\overline{U}_f\} = \{\overline{u}_x{}^0 \; \overline{u}_y{}^0 \; i\overline{u}_z{}^0 \; \overline{u}_x{}^1 \; \overline{u}_y{}^1 \; i\overline{u}_z{}^1 \; \overline{u}_x{}^2 \; \overline{u}_y{}^2 \; i\overline{u}_z{}^2 \; \overline{W}^2 \; \overline{V}^2\}^T$, superscripts 0, 1, 2 correspond to different layer positions shown from top to bottom in the three-layered model, and $[K^f]$ is a matrix of 11×11, a total stiffness matrix of a rigid pavement expressway model is:

$\{\Sigma_r\} = [K^r]\{\overline{U}_r\}$, wherein $\{\overline{\Sigma}_r\} = \{-\overline{\tau}_{xz,b}{}^1 \; -\overline{\tau}_{yz,b}{}^1 \; -i\overline{\tau}_{zz,b}{}^1 \; 0\;0\;0\;0\;0\}^T$, $\{\overline{U}_r\} = \{\overline{u}_x{}^1 \; \overline{u}_y{}^1 \; i\overline{u}_z{}^1 \; \overline{u}_x{}^2 \; \overline{u}_y{}^2 \; i\overline{u}_z{}^2 \; \overline{W}^2 \; \overline{V}^2\}^T$, and $[K^r]$ is a matrix of 8×8.

The processor 401 is further configured to determine a load form and a load size according to a specific vehicle, substitute the load form and the load size as boundary conditions into the stiffness matrix of a corresponding model to solve and obtain a solution $\overline{f}$ of the parameter to be solved in a frequency domain, wherein the load form and the load size determined according to the specific vehicle are $$f(x_1, y_1, t) = \begin{cases} \dfrac{Pe^{i\Omega_0 t}}{40l_1 l_{22}}; & \begin{cases} (d_a - l_1) \le x_1 - Vt \le (d_a + l_1), (d_w + d_t - l_2) \le |y_1| \le (d_w + d_t + l_2) \\ (d_a - l_1) \le x_1 - Vt \le (d_a + l_1), (d_w - d_t - l_2) \le |y_1| \le (d_w - d_t + l_2) \\ (-d_a - l_1) \le x_1 - Vt \le (-d_a + l_1), (d_w + d_t - l_2) \le |y_1| \le (d_w + d_t + l_2) \\ (-d_a - l_1) \le x_1 - Vt \le (-d_a + l_1), (d_w - d_t - l_2) \le |y_1| \le (d_w - d_t + l_2) \\ (d_a - l_1) \le x_1 - Vt \le (d_a + l_1), (d_w - l_2) \le |y_1| \le (d_w + l_2) \end{cases} \\ 0; & \text{others} \end{cases}$$

wherein P represents a total axle load of the specific vehicle, and in a moving coordinate system, $x = x_1 - Vt$, $y = y_1$, $z = z_1$, wherein in the transform domain, the load form and the load size determined according to the specific vehicle are $$\overline{f}(\beta, \gamma) = \dfrac{P(e^{-i\gamma d_w} + e^{i\gamma d_w})}{10 l_1 l_2 \beta \gamma}$$
$$[\sin(\beta l_1)\sin(\gamma l_2) e^{-i\beta d_c} + \sin(\beta l_1)\sin(\gamma l_2)(e^{-i\beta d_a} + e^{i\beta d_a})(e^{-i\gamma d_t} + e^{i\gamma d_t})],$$

a boundary condition of the rigid pavement expressway model is:

$$\begin{cases} \tau^1_{zz,b}(x, y, t) = -\varphi(x, y, t) \\ \tau^1_{xz,b}(x, y, t) = \tau^1_{yz,b}(x, y, t) = p^2_w(x, y, t) = p^2_a(x, y, t) = 0, \\ u^1_{zz,b}(x, y, t) = W(x, y, t) \end{cases}$$

the boundary condition of the rigid pavement expressway model with the time term $e^{i\Omega_0 t}$ removed is expressed as:

$$\begin{cases} \overline{\tau}^1_{zz,b}(\beta, \gamma) = -\overline{\varphi}(\beta, \gamma) \\ \overline{\tau}^1_{xz,b}(\beta, \gamma) = \overline{\tau}^1_{yz,b}(\beta, \gamma) = \overline{p}^2_w(\beta, \gamma) = \overline{p}^2_a(\beta, \gamma) = 0, \\ \overline{u}^1_{zz,b}(\beta, \gamma) = \overline{W}(\beta, \gamma) \end{cases}$$

wherein $$\overline{\varphi}(\beta, \gamma) = \dfrac{\overline{f}(\beta, \gamma)}{1 + B_{33} D_P (\beta^2 + \gamma^2)^2 - B_{33} \omega^2 m_b},$$

and $B_{33}$ is an element in a third row and a third column of $[K^r]^{-1}$ and corresponds to a vertical displacement of the base layer, a boundary condition of the flexible pavement expressway model is:

$$\begin{cases} \tau^0_{zz,p}(x, y, t) = f(x, y, t) \\ \tau^0_{xz}(x, y, t) = \tau^0_{yz}(x, y, t) = p^2_w(x, y, t) = p^2_a(x, y, t) = 0 \end{cases},$$

the boundary condition of the flexible pavement expressway model with the time term $e^{i\Omega_0 t}$ removed is expressed as:

$$\begin{cases} \overline{\tau}^0_{zz,p}(\beta, \gamma) = \overline{f}(\beta, \gamma) \\ \overline{\tau}^0_{xz}(\beta, \gamma) = \overline{\tau}^0_{yz}(\beta, \gamma) = \overline{p}^2_w(\beta, \gamma) = \overline{p}^2_a(\beta, \gamma) = 0 \end{cases},$$

wherein for the rigid pavement expressway model, the corresponding boundary condition is substituted into the total stiffness matrix of the rigid pavement expressway model, and for the flexible pavement expressway model, the corresponding boundary condition is substituted into the total stiffness matrix of the flexible pavement expressway model, in such a way to obtain the displacement of each surface, the displacement $\{\overline{u}_x{}^2 \; \overline{u}_y{}^2 \; i\overline{u}_z{}^2 \; \overline{W}^2 \; \overline{V}^2\}$ of the top surface of the subgrade is substituted into the stress-strain relationship of the unsaturated subgrade in the transform domain to obtain a stress $\{\overline{\tau}_{xz,s} \; \overline{\tau}_{yz,s} \; \overline{\tau}_{zz,s} \; \overline{p}_w \; \overline{p}_\alpha\}$ and a displacement $\{\overline{u}_x{}^2 \; \overline{u}_y{}^2 \; \overline{u}_z{}^2 \; \overline{W}^2 \; \overline{V}^2\}$ at any position inside the subgrade in the frequency domain, and the vibration velocity of $\overline{v}_{ij} = i\omega \overline{u}_{ij}$ and an acceleration of $\overline{a}_{ij} = \omega^2 \overline{u}_{ij}$ of the subgrade can be calculated according to the displacement.

The processor 401 is further configured to us an inverse fast Fourier transform to convert the solution $\overline{f}$ of the parameter to be solved in the frequency domain into a solution f in the time domain, wherein the solution f in the time domain is a stress $\{\tau_{xz,s} \; \tau_{yz,s} \; \tau_{zz,s} \; p_w \; p_\alpha\}$, a displacement $\{u^2_x \; u^2_y \; u^2_z \; W^2 \; V_2\}$, a velocity $v_{ij}$ and an acceleration $a_{ij}$.

Those skilled in the art can clearly understand that, for the convenience and brevity of the description, regarding the apparatus for determining the performance of the subgrade of the expressway section, a processing device, and the specific working process of a corresponding unit thereof as described above, reference can be made to the explanation of the method for determining the performance of the subgrade of the expressway section in e.g. the embodiment corresponding to FIG. 1, which will not be reiterated herein.

Those ordinarily skilled in the art can understand that all or part of the steps of the various methods in the above embodiments can be completed by instructions, or by relevant hardware controlled by instructions. The instructions can be stored in a computer readable storage medium, and loaded and executed by a processor.

Therefore, the present disclosure provides a computer readable storage medium, in which a plurality of instructions is stored. The instructions can be loaded by the processor to execute the steps of the method for determining a performance of an unsaturated subgrade of a multi-layered expressway section in e.g. the embodiment corresponding to FIG. 1 of the present disclosure. For specific operation, reference can be made to the explanation of the method for determining the performance of the subgrade of the expressway section in e.g. the embodiment corresponding to FIG. 1, which will not be reiterated herein.

Wherein the computer readable storage medium may include a read-only memory (ROM), a random access memory (RAM), a disk or a compact disk, etc.

Since the instruction stored in the computer readable storage medium can execute the steps of the method in e.g. the embodiment corresponding to FIG. 1 of the present disclosure, the advantageous effects of the method for determining a performance of an unsaturated subgrade of a multi-layered expressway section in e.g. the embodiment corresponding to FIG. 1 of the present disclosure can be achieved as stated above in detail, which will not be reiterated herein.

The method and apparatus for determining a performance of an unsaturated subgrade of a multi-layered expressway section, the processing device and the computer readable storage medium provided by the present disclosure are introduced above in detail. Specific examples are used herein to expound the principle and implementation modes of the present disclosure. The above explanations of embodiments are only used to help people understand the method and core idea of the present disclosure; and meanwhile, for those skilled in the art and according to the idea of the present disclosure, there may be changes in the specific implementation modes and application scope. In summary, the contents of the specification should not be construed as any limitation to the present disclosure.

What is claimed is:

1. A method for determining a performance of a subgrade of an expressway section, comprising:

Step S101: a processing device using an Odemark equivalent hypothesis of modulus-thickness to simplify a road structure of a target expressway section into a three-layered model;

Step S102: based on the three-layered model, the processing device setting a base layer of the target expressway section as an elastic medium and setting the subgrade of the target expressway section as an unsaturated porous medium, to derive and obtain a rigid pavement governing equation, a flexible pavement and base layer governing equation and an unsaturated subgrade governing equation;

Step S103: based on an action form of a vehicle load, the processing device respectively setting time terms of variables in the rigid pavement governing equation, the flexible pavement and base layer governing equation and the unsaturated subgrade governing equation as a simple harmonic form $e^{i\Omega_0 t}$ and separating the simple harmonic form $e^{i\Omega_0 t}$ of the time terms from the rigid pavement governing equation, the flexible pavement and base layer governing equation and the unsaturated subgrade governing equation, and then using a double Fourier transform to respectively reduce partial derivatives in a three-dimensional space domain of the rigid pavement governing equation, the flexible pavement and base layer governing equation and the unsaturated subgrade governing equation as ordinary differential equations, to obtain element stiffness matrices of different layer positions after solving and then establish a total dynamic stiffness matrix;

Step S104: the processing device determining a load form and a load size according to a specific vehicle, substituting the load form and the load size as boundary conditions into the total dynamic stiffness matrix of a corresponding model to solve and obtain a solution $\bar{f}$ of a parameter to be solved in a frequency domain; and Step S105: the processing device using an inverse fast Fourier transform to convert the solution $\bar{f}$ of the parameter to be solved in the frequency domain into a solution f in a time domain, wherein the solution f in the time domain is a stress $\{\tau_{xz,s}\ \tau_{yz,s}\ \tau_{zz,s}\ p_w\ p_\alpha\}$, a displacement $\{u^2_x\ u^2_y\ u^2_z\ W^2\ V^2\}$, a velocity $v_{ij}$ and an acceleration $a_{ij}$;

wherein, in the Step S101, the three-layered model is:

$$H_e = \left(\frac{E}{E_1}\right)^{1/3} H,$$

wherein $H_e$ is an equivalent thickness, E is a modulus of a layer to be transformed, H is a thickness of the layer to be transformed, and $E_1$ is a modulus of a target layer;

wherein, in the step S102, the rigid pavement governing equation is:

$$D_p\left[\frac{\partial^4 W(x,y,t)}{\partial x^4} + 2\frac{\partial^4 W(x,y,t)}{\partial x^2 \partial y^2} + \frac{\partial^4 W(x,y,t)}{\partial y^4}\right] + \rho_p h_p \ddot{W}(x,y,t) + \varphi(x,y,t) = f(x,y,t)$$

wherein $D_p = E_p h_p^3/[12(1-\mu_p^2)]$ is a bending rigidity of a pavement slab, W(x, y, t) is a vertical displacement of the pavement slab, $E_p$, $\rho_p$ and $h_p$ are respectively a modulus, a density and a thickness of the pavement slab, f(x, y, t) is a traffic load on the pavement slab, and $\varphi(x, y, t)$ is a reaction force exerted by the base layer on the pavement slab, the flexible pavement and base layer governing equation is:

$$\begin{cases} G_b u^b_{i,jj} + (\lambda_b + G_b)u^b_{j,ji} = \rho_b \ddot{u}^b_i \\ \tau^b_{ij} = \lambda_b \theta_b \delta_{ij} + 2G_b \varepsilon^b_{ij} \end{cases},$$

wherein $u^b$ is a displacement of an elastic medium layer, $G_b$ and $\lambda_b$ are Lame constants of the elastic medium layer, $\rho_b$ is a density of the elastic medium layer, $\tau^b$ is a stress of the elastic medium layer, $\tau^b$ and $\varepsilon^b$ respectively represent the stress of the elastic medium layer and a strain of the elastic medium layer, and $\delta_{ij}$ is a Kronecker symbol, wherein, the unsaturated subgrade governing equation is:

$$\begin{cases} -p_{w,i} = \rho_w \ddot{u}_i + \frac{\rho_w}{nS_r}\ddot{W}_i + \frac{\rho_w g}{k_w}\dot{W}_i \\ -p_{a,i} = \rho_a \ddot{u}_i + \frac{\rho_a}{n(1-S_r)}\ddot{V}_i + \frac{\rho_a g}{k_a}\dot{V}_i \\ A_{11}\dot{p}_w + A_{12}\dot{p}_a + A_{13}\nabla \cdot \dot{u}_i + A_{14}\nabla \cdot \dot{V}_i = 0 \\ A_{21}\dot{p}_w + A_{22}\dot{p}_a + A_{23}\nabla \cdot \dot{u}_i + A_{24}\nabla \cdot \dot{W}_i = 0 \\ \mu\nabla^2\mu_i + (\lambda+G)\nabla e - a\chi\nabla p_w - a(1-\chi)\nabla p_a = \rho\ddot{u}_i + \rho_w\ddot{W}_i + \rho_a\ddot{V}_i \end{cases}$$

wherein $$A_{11} = nA_s + (1-S_r)\frac{a\chi - nS_r}{K_s},$$

$$A_{12} = (1-S_r)\left[\frac{a(1-\chi) - n(1-S_r)}{K_s} + \frac{n}{K_a}\right] - nA_s,$$

$$A_{13} = (1-S_r)\left(1 - \frac{K_b}{K_s}\right),$$

$$A_{14} = 1,$$

$$A_{21} = \frac{(a\chi - nS_r)S_r}{K_s} - nA_s + \frac{nS_r}{K_w},$$

$$A_{22} = \frac{[a(1-\chi) - n(1-S_r)]S_r}{K_s} + nA_s,$$

$$A_{23} = \left(1 - \frac{K_b}{K_s}\right)S_r,$$

$$A_{24} = 1,$$

$$A_s = -\alpha m d(1-S_{w0})(S_e)^{\frac{m+1}{m}}\left[(S_e)^{-\frac{1}{m}} - 1\right]^{\frac{d-1}{d}},$$

$$a = 1 - K_b/K_s,$$

$K_b$ and $K_s$ are bulk compressibility moduli of soil skeletons and soil particles respectively, $p_w$ and $p_a$ are pressures of pore water and gas respectively, $\rho_w$ and $\rho_a$ are densities of pore water and gas respectively, $W_i$ and $V_i$ are displacement components of pore water and pore gas relative to soil particles in an i direction, g represents a gravitational acceleration, $k_w$ and $k_a$ represent permeability coefficients of pore water and pore gas respectively, $\chi$ is an effective stress parameter, $\alpha$, m and d are fitting parameters of a soil-water characteristic curve model, $S_e$ is an effective saturation, $S_{w0}$ is an irreducible saturation, n is a soil porosity, and $S_r$ is a saturation;

wherein, in the Step S103, the double Fourier transform is:

$$\bar{f}(\beta, \gamma, z, t) = \int_{-\infty}^{\infty}\int_{-\infty}^{\infty} f(x, y, z, t)e^{-i(\beta x + \gamma y)}dxdy,$$

$$f(x, y, z, t) = \frac{1}{4\pi^2}\int_{-\infty}^{\infty}\int_{-\infty}^{\infty} \bar{f}(\beta, \gamma, z, t)e^{i(\beta x + \gamma y)}d\beta d\gamma,$$

wherein $\beta$ and $\gamma$ are wave numbers in x and y directions respectively, and f and $\bar{f}$ are variables in the three-dimensional space domain and a corresponding transform domain respectively, the rigid pavement governing equation in the transform domain is:

$$\overline{W}(\beta,\gamma)[D_p(\beta^2+\gamma^2)^2 - \Omega^2\rho_p h_p] + \overline{\varphi}(\beta,\gamma) = \bar{f}(\beta,\gamma),$$

a stress-strain relationship of the flexible pavement in the transform domain is:

$$\left\{\overline{\sum}_P\right\} = [S^p][D^p]^{-1}\{\bar{U}_P\} = [K^p]\{\bar{U}_P\},$$

$$[D^p] = \begin{bmatrix} \frac{-i\beta e^{-\alpha_1 h}}{k_1^2} & \frac{-i\beta}{k_1^2} & e^{-\alpha_2 h} & 1 & 0 & 0 \\ \frac{-i\gamma e^{-\alpha_1 h}}{k_1^2} & \frac{-i\gamma}{k_1^2} & 0 & 0 & e^{-\alpha_2 h} & 1 \\ \frac{-i\alpha_1 e^{-\alpha_1 h}}{k_1^2} & \frac{i\alpha_1}{k_1^2} & \frac{\beta}{\alpha_2}e^{-\alpha_2 h} & \frac{-\beta}{\alpha_2} & \frac{\gamma}{\alpha_2}e^{-\alpha_2 h} & \frac{-\gamma}{\alpha_2} \\ \frac{-i\beta}{k_1^2} & \frac{-i\beta e^{-\alpha_1 h}}{k_1^2} & 1 & e^{-\alpha_2 h} & 0 & 0 \\ \frac{-i\gamma}{k_1^2} & \frac{-i\gamma e^{-\alpha_1 h}}{k_1^2} & 0 & 0 & 1 & e^{-\alpha_2 h} \\ \frac{-i\alpha_1}{k_1^2} & \frac{i\alpha_1 e^{-\alpha_1 h}}{k_1^2} & \frac{\beta}{\alpha_2} & \frac{-\beta}{\alpha_2}e^{-\alpha_2 h} & \frac{\gamma}{\alpha_2} & \frac{-\gamma}{\alpha_2}e^{-\alpha_2 h} \end{bmatrix},$$

$$[S^p] = G_p \begin{bmatrix} \frac{2i\beta\alpha_1}{k_1^2}e^{-\alpha_1 h} & -\frac{2i\beta\alpha_1}{k_1^2} & -\frac{(\alpha_2^2+\beta^2)}{\alpha_2}e^{-\alpha_2 h} & \frac{(\alpha_2^2+\beta^2)}{\alpha_2} & -\frac{\beta\gamma}{\alpha_2}e^{-\alpha_2 h} & \frac{\beta\gamma}{\alpha_2} \\ \frac{2i\gamma\alpha_1}{k_1^2}e^{-\alpha_1 h} & -\frac{2i\gamma\alpha_1}{k_1^2} & -\frac{\beta\gamma}{\alpha_2}e^{-\alpha_2 h} & \frac{\beta\gamma}{\alpha_2} & -\frac{(\alpha_2^2+\gamma^2)}{\alpha_2}e^{-\alpha_2 h} & \frac{(\alpha_2^2+\gamma^2)}{\alpha_2} \\ \frac{i(2\alpha_2^2+k_2^2)}{k_1^2}e^{-\alpha_1 h} & \frac{i(2\alpha_2^2+k_2^2)}{k_1^2} & -2\beta e^{-\alpha_2 h} & -2\beta & -2\gamma e^{-\alpha_2 h} & -2\gamma \\ \frac{-2i\beta\alpha_1}{k_1^2} & \frac{2i\beta\alpha_1}{k_1^2}e^{-\alpha_1 h} & \frac{(\alpha_2^2+\beta^2)}{\alpha_2} & -\frac{(\alpha_2^2+\beta^2)}{\alpha_2}e^{-\alpha_2 h} & \frac{\beta\gamma}{\alpha_2} & -\frac{\beta\gamma}{\alpha_2}e^{-\alpha_2 h} \\ \frac{-2i\gamma\alpha_1}{k_1^2} & \frac{2i\gamma\alpha_1}{k_1^2}e^{-\alpha_1 h} & \frac{\beta\gamma}{\alpha_2} & -\frac{\beta\gamma}{\alpha_2}e^{-\alpha_2 h} & \frac{(\alpha_2^2+\gamma^2)}{\alpha_2} & -\frac{(\alpha_2^2+\gamma^2)}{\alpha_2}e^{-\alpha_2 h} \\ \frac{-i(2\alpha_2^2+k_2^2)}{k_1^2} & \frac{-i(2\alpha_2^2+k_2^2)}{k_1^2}e^{-\alpha_1 h} & 2\beta & 2\beta e^{-\alpha_2 h} & 2\gamma & 2\gamma e^{-\alpha_2 h} \end{bmatrix},$$

wherein a stress vector $\{\overline{\Sigma}_P\} = \{-\bar{\tau}_{xz,p}{}^0 \ -\bar{\tau}_{yz,p}{}^0 \ -i\bar{\tau}_{zz,p}{}^0 \ \bar{\tau}_{xz,p}{}^1 \ -\bar{\tau}_{yz,p}{}^1 \ i\bar{\tau}_{zz,p}{}^1\}^T$, $[D^p]$ is a displacement matrix of the flexible pavement, $[S^p]$ is a stress matrix of the flexible pavement, a displacement vector $\{\overline{U}_P\} = \{\bar{u}_{x,p}{}^0 \ \bar{u}_{y,p}{}^0 \ i\bar{u}_{z,p}{}^0 \ \bar{u}_{x,p}{}^1 \ \bar{u}_{y,p}{}^1 \ i\bar{u}_{z,p}{}^1\}^T$, $[K^p] = [S^p][D^p]^{-1}$ is a dynamic stiffness matrix of the flexible pavement layer, $$\alpha_1^2 = \beta^2 + \gamma^2 - k_1^2,$$

-continued $\alpha_2^2 = \beta^2 + \gamma^2 - k_2^2,$ $k_1^2 = \dfrac{\omega^2}{c_1^2},$ $k_2^2 = \dfrac{\omega^2}{c_2^2},$ c is a traffic load velocity, $c_1$ and $c_2$ are a compression wave velocity and a shear wave velocity of the elastic medium, respectively, $\omega = \Omega_0 - \beta c$, h represents a thickness of the flexible pavement layer, and i is an imaginary number, wherein superscript 0 of elements in the stress vector and in the displacement vector represents a top surface of a flexible pavement layer, and superscript 1 of elements in the stress vector and in the displacement vector represents a bottom surface of the flexible pavement layer;

wherein a stress-strain relationship of the elastic base layer in the transform domain is:

$\{\Sigma_b\} = [S^b][D^b]^{-1}\{\overline{U}_b\} = [K^b]\{\overline{U}_b\},$ a stress-strain relationship of the unsaturated subgrade in the transform domain is:

$\left\{\sum_s\right\} = [S^s][D^s]^{-1}\{\overline{U}_s\} = [K^s]\{\overline{U}_s\},$ $$[D^s] = \begin{bmatrix} -\dfrac{\gamma}{\beta}e^{-\lambda_0 z} & \dfrac{i\lambda_0}{\beta}e^{-\lambda_0 z} & S_1 i\beta e^{-\lambda_1 z} & S_2 i\beta e^{-\lambda_2 z} & S_3 i\beta e^{-\lambda_3 z} \\ e^{-\lambda_0 z} & 0 & S_1 i\gamma e^{-\lambda_1 z} & S_2 i\gamma e^{-\lambda_2 z} & S_3 i\gamma e^{-\lambda_3 z} \\ 0 & -ie^{-\lambda_0 z} & -iS_1\lambda_1 e^{-\lambda_1 z} & -iS_2\lambda_2 e^{-\lambda_2 z} & -iS_3\lambda_3 e^{-\lambda_3 z} \\ 0 & -\dfrac{\omega^2}{b^w}e^{-\lambda_0 z} & -\dfrac{B_{w1}}{b^w \rho_w}e^{-\lambda_1 z} & -\dfrac{B_{w2}}{b^w \rho_w}e^{-\lambda_2 z} & -\dfrac{B_{w3}}{b^w \rho_w}e^{-\lambda_3 z} \\ 0 & -\dfrac{\omega^2}{b^a}e^{-\lambda_0 z} & -\dfrac{B_{a1}}{b^a \rho_a}e^{-\lambda_1 z} & -\dfrac{B_{a2}}{b^a \rho_a}e^{-\lambda_2 z} & -\dfrac{B_{a3}}{b^a \rho_a}e^{-\lambda_3 z} \end{bmatrix}$$

$$[S^s] = \begin{bmatrix} -\dfrac{\gamma \lambda_0 G}{\beta}e^{-\lambda_0 z} & iG\left(\dfrac{\lambda_0^2}{\beta}+\beta\right)e^{-\lambda_0 z} & 2GS_1 i\beta\lambda_1 e^{-\lambda_1 z} & 2GS_2 i\beta\lambda_2 e^{-\lambda_2 z} & 2GS_3 i\beta\lambda_3 e^{-\lambda_3 z} \\ G\lambda_0 e^{-\lambda_0 z} & iG\gamma e^{-\lambda_0 z} & 2GS_1 i\gamma\lambda_1 e^{-\lambda_1 z} & 2GS_2 i\gamma\lambda_2 e^{-\lambda_2 z} & 2GS_3 i\gamma\lambda_3 e^{-\lambda_3 z} \\ 0 & -i2G\lambda_0 e^{-\lambda_0 z} & -iB_1 e^{-\lambda_1 z} & -iB_2 e^{-\lambda_2 z} & -iB_3 e^{-\lambda_3 z} \\ 0 & 0 & -f_{w1}e^{-\lambda_1 z} & -f_{w2}e^{-\lambda_2 z} & -f_{w3}e^{-\lambda_3 z} \\ 0 & 0 & -f_{a1}e^{-\lambda_1 z} & -f_{a2}e^{-\lambda_2 z} & -f_{a3}e^{-\lambda_3 z} \end{bmatrix},$$

wherein $\left\{\sum_s\right\} = \{-\overline{\tau}_{xz,s} \;\; -\overline{\tau}_{yz,s} \;\; -i\overline{\tau}_{zz,s} \;\; -\overline{p}_w \;\; -\overline{p}_a\}^T,$ $\{\overline{U}_s\} = \{\overline{u}_{x,s} \;\; \overline{u}_{y,s} \;\; i\overline{u}_{z,s} \;\; \overline{W} \;\; \overline{V}\}^T,$ $B_{wn} = \omega^2 \rho_w S_n \lambda_n - f_{wn}\lambda_n,$ $B_{an} = \omega^2 \rho_a S_n \lambda_n - f_{an}\lambda_n,$ $B_n = 2\mu S_n \lambda_n^2 + \lambda - a\chi f_{wn} - a(1-\chi)f_{an},$ $S_n = -\dfrac{\lambda + \mu + b_1 f_{wn} + b_2 f_{an}}{b_3 + \mu d_n},$ $f_{an} = \dfrac{b_{13}b_{31} - b_{11}b_{33} + b_{11}d_n}{b_{11}b_{32} - b_{31}b_{12} + b_{31}d_n},$ $f_{wn} = \dfrac{b_{32}b_{23} - b_{22}b_{33} + b_{22}d_n}{b_{22}b_{31} - b_{32}b_{21} + b_{32}d_n},$ $\lambda_n = \sqrt{\beta^2 + \gamma^2 + d_n},$ $d_n$ is roots of an equation $d_n^3 + b_4 d_n^2 + b_5 d_n + b_6 = 0, \; b_4 = -b_{12} - b_{33} - b_{21},$ $b_5 = b_{12}b_{33} - b_{13}b_{32} + b_{21}b_{12} + b_{21}b_{33} - b_{22}b_{11} - b_{23}b_{31},$ $b_6 = -b_{21}b_{12}b_{33} - b_{13}b_{31}b_{22} - b_{23}b_{11}b_{32} + b_{21}b_{13}b_{32} + b_{22}b_{11}b_{33} + b_{23}b_{31}b_{12},$ $n = 1, 2, 3, \; b_1 = -a\chi - \dfrac{\omega^2}{b^w},$ $b_2 = -a(1-\chi) - \dfrac{\omega^2}{b^a},$ $b_3 = \rho\omega^2 + \dfrac{\omega^4 \rho_w}{b^w} + \dfrac{\omega^4 \rho_a}{b^a},$ $b_{11} = b^a \rho_a A_{11},$ $b_{12} = b^a \rho_a A_{12},$ $b_{13} = \omega^2 \rho_a + b^a \rho_a A_{13},$ $b_{21} = b^w \rho_w A_{21},$ $b_{22} = b^w \rho_w A_{22},$ -continued $b_{23} = \omega^2 \rho_w + b^w \rho_w A_{23},$ $b_{31} = -\dfrac{b_1 b_{21} + b_2 b_{11}}{\lambda + 2\mu},$ $b_{32} = -\dfrac{b_1 b_{22} + b_2 b_{12}}{\lambda + 2\mu},$ $b_{33} = -\dfrac{b_1 b_{23} + b_2 b_{13} + b_3}{\lambda + 2\mu},$ $b^w = -\dfrac{\omega^2}{nS_r} + \dfrac{i\omega g}{k_w},$ $b^a = -\dfrac{\omega^2}{n(1-S_r)} + \dfrac{i\omega g}{k_a},$ a total stiffness matrix of a flexible pavement expressway model is:

$\{\Sigma_f\} = [K^f]\{\overline{U}_f\},$ wherein $\{\Sigma_f\} = \{-\overline{\tau}_{xz,p}{}^0 \;\; -\overline{\tau}_{yz,p}{}^0 \;\; -i\overline{\tau}_{zz,p}{}^0 \;\; 0 \; 0 \; 0 \; 0 \; 0 \; 0 \; 0 \; 0\}^T,$
$\{\overline{U}_f\} = \{\overline{u}_x{}^0 \;\; \overline{u}_y{}^0 \;\; i\overline{u}_z{}^0 \;\; \overline{u}_x{}^1 \;\; \overline{u}_y{}^1 \;\; i\overline{u}_z{}^1 \;\; \overline{u}_x{}^2 \;\; \overline{u}_y{}^2 \;\; i\overline{u}_z{}^2 \;\; \overline{W}^2 \;\; \overline{V}^2\}^T,$ superscripts 0, 1, 2 correspond to different layer positions shown from top to bottom in the three-layered model, and [$K^f$] is a matrix of 11×11, a total stiffness matrix of a rigid pavement expressway model is:

$$\{\Sigma_r\} = [K^r]\{U_r\},$$

wherein $\{\Sigma_r\} = \{-\bar{\tau}_{xz,b}{}^1 \; -\bar{\tau}_{yz,b}{}^1 \; -i\bar{\tau}_{zz,b}{}^1 \; 0 \; 0 \; 0 \; 0 \; 0\}^T$, $\{U_r\} = \{\bar{u}_x{}^1 \; \bar{u}_y{}^1 \; i\bar{u}_z{}^1 \; \bar{u}_x{}^2 \; \bar{u}_y{}^2 \; i\bar{u}_z{}^2 \; W^2 \; V^2\}^T$, and [$K^r$] is a matrix of 8×8;

wherein in the Step S104, the load form and the load size determined according to the specific vehicle are:

$$f(x_1, y_1, t) = \begin{cases} \dfrac{Pe^{i\Omega_0 t}}{40 l_1 l_2}; & \begin{cases} (d_a - l_1) \le x_1 - Vt \le (d_a + l_1), (d_w + d_t - l_2) \le |y_1| \le (d_w + d_t + l_2) \\ (d_a - l_1) \le x_1 - Vt \le (d_a + l_1), (d_w - d_t - l_2) \le |y_1| \le (d_w - d_t + l_2) \\ (-d_a - l_1) \le x_1 - Vt \le (-d_a + l_1), (d_w + d_t - l_2) \le |y_1| \le (d_w + d_t + l_2), \\ (-d_a - l_1) \le x_1 - Vt \le (-d_a + l_1), (d_w - d_t - l_2) \le |y_1| \le (d_w - d_t + l_2) \\ (d_c - l_1) \le x_1 - Vt \le (d_c + l_1), (d_w - l_2) \le |y_1| \le (d_w + l_2) \end{cases} \\ 0; \text{others} \end{cases}$$

wherein P represents a total axle load of the specific vehicle, and in a moving coordinate system, $x = x_1 - Vt$, $y = y_1$, $z = z_1$, wherein in the transform domain, the load form and the load size determined based on the specific vehicle are:

$$\bar{f}(\beta, \gamma) = \dfrac{P(e^{-i\gamma d_w} + e^{i\gamma d_w})}{10 l_1 l_2 \beta \gamma} [\sin(\beta l_1)\sin(\gamma l_2)e^{-i\beta d_c} + \sin(\beta l_1)\sin(\gamma l_2)(e^{-i\beta d_a} + e^{i\beta d_a})(e^{-i\gamma d_t} + e^{i\gamma d_t})],$$

a boundary condition of the rigid pavement expressway model is:

$$\begin{cases} \tau^1_{zz,b}(x, y, t) = -\varphi(x, y, t) \\ \tau^1_{xz,b}(x, y, t) = \tau^1_{yz,b}(x, y, t) = p^2_w(x, y, t) = p^2_a(x, y, t) = 0, \\ u^1_{zz,b}(x, y, t) = W(x, y, t) \end{cases}$$

the boundary condition of the rigid pavement expressway model with a time term $e^{i\Omega_0 t}$ removed is expressed as:

$$\begin{cases} \bar{\tau}^1_{zz,b}(\beta, \gamma) = -\bar{\varphi}(\beta, \gamma) \\ \bar{\tau}^1_{xz,b}(\beta, \gamma) = \bar{\tau}^1_{yz,b}(\beta, \gamma) = \bar{p}^2_w(\beta, \gamma) = \bar{p}^2_a(\beta, \gamma) = 0, \\ \bar{u}^1_{zz,b}(\beta, \gamma) = \bar{W}(\beta, \gamma) \end{cases}$$

wherein $$\bar{\varphi}(\beta, \gamma) = \dfrac{\bar{f}(\beta, \gamma)}{1 + B_{33} D_P (\beta^2 + \gamma^2)^2 - B_{33} \omega^2 m_b},$$

and $B_{33}$ is an element in a third row and a third column of $[K^r]^{-1}$ and corresponds to a vertical displacement of the base layer, a boundary condition of the flexible pavement expressway model is:

$$\begin{cases} \tau^0_{zz,p}(x, y, t) = f(x, y, t) \\ \tau^0_{xz}(x, y, t) = \tau^0_{yz}(x, y, t) = p^2_w(x, y, t) = p^2_a(x, y, t) = 0 \end{cases},$$

the boundary condition of the flexible pavement expressway model with the time term $e^{i\Omega_0 t}$ removed is expressed as:

$$\begin{cases} \bar{\tau}^0_{zz,p}(\beta, \gamma) = \bar{f}(\beta, \gamma) \\ \bar{\tau}^0_{xz}(\beta, \gamma) = \bar{\tau}^0_{yz}(\beta, \gamma) = \bar{p}^2_w(\beta, \gamma) = \bar{p}^2_a(\beta, \gamma) = 0 \end{cases},$$

wherein for the rigid pavement expressway model, a corresponding boundary condition is substituted into the total stiffness matrix of the rigid pavement expressway model, and for the flexible pavement expressway model, the corresponding boundary condition is substituted into the total stiffness matrix of the flexible pavement expressway model, in such a way to obtain a displacement of each surface, then a displacement $\{\bar{u}_x{}^2 \; \bar{u}_y{}^2 \; i\bar{u}_z{}^2 \; W^2 \; V^2\}$ of the top surface of the subgrade is substituted into the stress-strain relationship of the unsaturated subgrade in the transform domain to obtain the a stress $\{\bar{\tau}_{xz,s} \; \bar{\tau}_{yz,s} \; \bar{\tau}_{zz,s} \; \bar{p}_w \; \bar{p}_\alpha\}$ and a displacement $\{\bar{u}_x{}^2 \; \bar{u}_y{}^2 \; \bar{u}_z{}^2 \; W^2 \; V^2\}$ at any position inside the subgrade in the frequency domain, and a vibration velocity $\bar{v}_{ij} = i\omega\bar{u}_{ij}$ and an acceleration $\bar{a}_{ij} = -\omega^2 \bar{u}_{ij}$ of the subgrade can be calculated according to the displacement.

2. The method according to claim 1, wherein prior to the Step S101, the method further comprises:

Step S106: the processing device acquiring a task of determining the performance of the subgrade of the target expressway section.

3. The method according to claim 1, wherein subsequent to the Step S105, the method further comprises:

Step S107: the processing device outputting the solution f in the time domain.

4. A processing device, comprising a processor and a memory in which a computer program is stored, wherein when the computer program in the memory is executed by the processor, the processor is configured to execute the method according to claim 1.

5. A non-transitory computer readable storage medium which stores a plurality of instructions that are suitable to be loaded by a processor to execute the method according to claim 1.

* * * * *